(12) United States Patent
Melzner et al.

(10) Patent No.: US 7,934,189 B2
(45) Date of Patent: Apr. 26, 2011

(54) METHOD OF MAKING AN INTEGRATED CIRCUIT INCLUDING SIMPLIFYING METAL SHAPES

(75) Inventors: Hanno Melzner, Sauerlach (DE); Olivier Rizzo, Roquebrune/Argens (FR); Jacques Herry, Draguigan (FR)

(73) Assignee: Infineon Technologies AG, Neubiberg (DE)

(*) Notice: Subject to any disclaimer, the term of this patent is extended or adjusted under 35 U.S.C. 154(b) by 567 days.

(21) Appl. No.: 12/020,176

(22) Filed: Jan. 25, 2008

(65) Prior Publication Data
US 2009/0193382 A1 Jul. 30, 2009

(51) Int. Cl.
*G06F 17/50* (2006.01)
(52) U.S. Cl. ......... 716/129; 716/126; 716/130; 716/131
(58) Field of Classification Search .............. 716/11–15, 716/126, 129, 130, 131
See application file for complete search history.

(56) References Cited

U.S. PATENT DOCUMENTS

| | | | |
|---|---|---|---|
| 5,557,533 A | 9/1996 | Koford et al. | |
| 5,619,420 A * | 4/1997 | Breid | 716/8 |
| 5,914,887 A | 6/1999 | Scepanovic et al. | |
| 6,052,677 A | 4/2000 | Masuoka et al. | |
| 6,360,191 B1 | 3/2002 | Koza et al. | |
| 6,363,519 B1 | 3/2002 | Levi et al. | |
| 7,356,781 B2 | 4/2008 | Koeder et al. | |
| 7,698,679 B2 * | 4/2010 | Rizzo et al. | 716/12 |
| 2001/0047507 A1 | 11/2001 | Pileggi et al. | |
| 2007/0198960 A1 * | 8/2007 | Fotakis et al. | 716/7 |
| 2008/0134122 A1 * | 6/2008 | Fotakis et al. | 716/14 |
| 2009/0319960 A1 * | 12/2009 | Lin | 716/2 |

* cited by examiner

*Primary Examiner* — Vuthe Siek
(74) *Attorney, Agent, or Firm* — Dicke, Billig & Czaja, PLLC

(57) ABSTRACT

A method for simplifying metal shapes in an integrated circuit including receiving an incoming wire layout for at least one metal layer of an integrated circuit, the incoming wire layout for the at least one layer including a plurality of wires running in a preferred direction and a plurality of vias connected thereto. The method further includes segmenting each of the wires into a plurality of bricks according to a set of equally spaced parallel grid lines extending in direction which is perpendicular to the preferred direction such that each wire comprises a series of consecutive bricks with brick boundaries between consecutive bricks occurring at a grid line, defining each brick as a regular or complex brick based on at least one brick criteria, and defining brick groups based on one or more grouping criteria, wherein each group contains one or more consecutive bricks of a same wire and each brick belongs to only one group so that each wire comprises a series of one or more consecutive groups, and wherein groups containing at least one complex brick are defined as complex groups.

9 Claims, 21 Drawing Sheets

METHOD OF MAKING AN INTEGRATED CIRCUIT INCLUDING SIMPLIFYING METAL SHAPES

BACKGROUND

Integrated circuit (IC) logic cells typically consist of a pre-designed layout of transistors or non-specific collection of logic gates which are configured according to a set of rules such as design rules (e.g. minimum wire widths, minimum spacing between structures, etc.), timing rules, and antenna rules, among others. A plurality of such pre-designed or standard IC cells, each having a unique configuration and/or logical function, is referred to as a cell library. To form an IC, such as an application specific IC (ASIC), standard cells are selected from the cell library and arranged in a desired layout. The terminals of the arranged cells are then connected to each other and to external terminals or pins by metal wires to achieve the desired logical function of the IC.

This layout and wiring process is often referred to as the "place and route" step and is typically performed by automated "place and route tools" or "routers". Although configured in accordance with a set of applicable design rules, router-created wires are not always ideal for manufacturing and yield. For example, routers often employ minimum width wires when thicker wires, which are less sensitive to defect induced interruptions ("opens") than thinner wires, could be used. Routers also often place wires at minimum separation distances even when larger separation distances, which are less sensitive to defect induced bridges ("shorts"), could be used. Additionally, because routers typically assign wires to routing tracks which are at a regular pitch, unnecessary jogs are often created in wires when connecting wires to pins.

Furthermore, interaction between structures of the standard cell and those added by the router sometimes create complicated shapes, referred to as "ugly shapes", which are often, but not exclusively, near wire ends where the wire connects to via holes that vertically connect layers of the IC. These ugly shapes can introduce several problems. First, they increase data volume (i.e. file size) and runtimes of subsequent algorithms, such as those employed for optical proximity correction (OPC). They can also confuse such downstream algorithms or cause them to be more complication and error-prone. For example, when optimizing a wire end, an OPC algorithm must detect first the wire end and then make appropriate modifications. Both stops are more complicated if wire ends come in many and unpredictable variants.

Ugly shapes also create multiple variants of a structure within a cell. Because different variants of a structure have different "acceptance regions" (i.e. the manufacturing parameter space within which a structure is successfully fabricated), the "total acceptance region" (i.e. the intersection of all individual acceptance regions) will shrink. The main manufacturing parameters of the lithography processes used to form the ICs are exposure dose, focus, and misalignment. Ugly shapes which reduce or limit the acceptance region of the lithography parameters are referred to as "litho hot spots" and can reduce the reliability of the IC (by increasing the sensitivity to opens and shorts) and reduce manufacturing yield.

In upper metal layers (e.g. above Metal 1), several post-processing techniques (i.e. applied to the "incoming layout" wiring layout after it is provided by a router) have been employed to address the above described shortcomings. One technique, sometimes referred to as "hot spot fixing", involves performing a lithography simulation to predict the shape of structures (e.g. wires, vias) which will ultimately be formed in a wafer using a given lithography process. Shapes identified as being problematic (i.e. litho hot spots) are attempted to be manually or automatically modified in hopes of eliminating the hot spot. Such a technique works well if the shapes are simple and there is enough space in the neighborhood to enable such modifications. However, if the shapes are complicated and structures are densely packed, fixing one hot spot may create new hot spots in the neighborhood. This process is also time-consuming and costly, does not always identify all hot spots, and depends on the reliability of the lithography model employed, which may vary between manufacturing sites.

Another post-processing technique employs an algorithm which widens wires (e.g. wires which are at a minimum width when more space is available) and increases spacing between neighboring wires (e.g. wires at minimum spacing when more space is available) of the incoming wiring layout provided by a router. Using dimensions which are somewhat larger than the minimum dimensions which can be manufactured by a given lithography process helps to avoid hot spots. However, current versions of one such technique, sometimes referred to as spreading, fattening, and filling (SFF); because it also inserts fill structures, modify only long, straight portions of wires. Line ends and non-trivial or complicated shapes, including jogs and so-called ugly shapes, are not addressed and remain unchanged by SFF. Leaving such shapes unchanged while modifying other portions of a wire can lead to unnecessary jogs being created in a wire and potentially to the inadvertent creation of ugly shapes.

FIG. 1 is an illustrative example of a portion of a router-provided incoming wire layout 30 for an upper metal layer (i.e. above a first metal layer, M1), such as a second metal layer (M2). Jogs 32, 34, and 36 are respectively shown in wires 38, 40, and 42. FIG. 2 illustrates a modified wire layout 30' resulting from the application of the SFF process to incoming wire layout 30 of FIG. 1 which "spreads" (i.e. increases spacing between wires to greater than design rule minimum) and "fattens" (i.e. increases the width of wires to greater than design rule minimum) the wires of incoming wire layout 30

Comparing modified wire layout 30' of FIG. 2 to incoming wire layout 30 of FIG. 1, it is apparent that most wires, or at least portions of most wires, have increased widths (i.e. have been "fattened") and are at increased spacing from one another (i.e. have been "spread"). As part of the SFF process, it is also evident that jogs are inserted as required to maintain at least minimum spacing between wires and/or portions of wires. However, as illustrated by the region within dashed circle 44, because jogs 32, 34, and 36 are not addressed by the SFF process, series of otherwise unnecessary jogs need to be inserted in wires 38, 40, and 42 by the SFF process which can potentially lead to the creation of litho hot spots in modified wire layout 30'.

SUMMARY

In one embodiment, a method is provided for simplifying metal shapes in an integrated circuit. The method includes receiving an incoming wire layout for at least one metal layer of an integrated circuit, the incoming wire layout for the at least one layer including a plurality of wires running in a preferred direction and a plurality of vias connected thereto. The method further includes segmenting each of the wires into a plurality of bricks according to a set of equally spaced parallel grid lines extending in direction which is perpendicular to the preferred direction such that each wire comprises a series of consecutive bricks with brick boundaries between consecutive bricks occurring at a grid line, defining each brick as a regular or complex brick based on at least one brick criteria, and defining brick groups based on one or more grouping criteria, wherein each group contains one or more consecutive bricks of a same wire and each brick belongs to only one group so that each wire comprises a series of one or more consecutive groups, and wherein groups containing at least one complex brick are defined as complex groups.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of a method of configuring an integrated circuit are described herein which include shape simplification techniques including re-building or replacing problematic or complex portions of an incoming layout with simple and predictable structures, such as simple rectangles, for example. In one embodiment, by reducing the occurrence of complex shapes, the simple structures improve the operation, efficiency, and results of "downstream" processing techniques such as SFF and "Hot Spot Fixing" as described above, for example.

Figure 1:
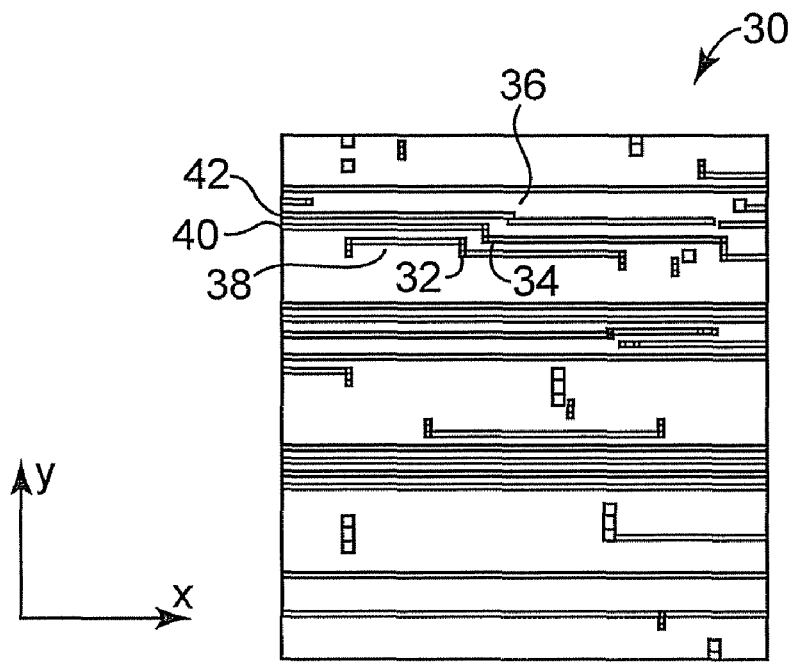
FIG. 1 is a diagram illustrating an example of a portion of a router-provided wire layout for an integrated circuit.

In one embodiment, the methodology described herein is based on a wire layout provided by any standard routing tool with such a layout being referred to herein as an "incoming layout", such as incoming layout 30 of FIG. 1. The incoming layout is assumed to be in accordance with a set of "hard rules" such as Design Rules (DRs), timing rules, and antenna rules, for example. For simplicity of discussion and explanation of the methodology, additional assumptions employed in the description herein include: that routing in a given layer of an IC runs in a horizontal direction (although any preferred direction is achieved by 90-degree rotation); that preferred directions of successive layers of an IC are perpendicular to one another (i.e. layers n and n+1 are perpendicular); that wires have defined left and right ends which terminate with one or more via holes and do not branch within a given layer (no "dead ends"); that all wires run from left-to-right or jog vertically (i.e. a vertical connector) and not from left-to-right (i.e. no "U-turns"); and that the minimum width of each wire is known (e.g. different wires may have different minimum widths depending on required current carrying capacity). It is noted that deviation from such assumptions requires additional software or implementation efforts but does not impact underlying principles of the methodology.

The operations of embodiments of the methodology are described and explained herein, at least in part, in an on-going fashion by example wire layout structures (e.g. wires, via holes) first introduced and illustrated by FIG. 3 below. Initially, original wire shapes of an incoming layout are read from an associated design data base, such as a design database for incoming layout 30 of FIG. 1.

Figure 3:
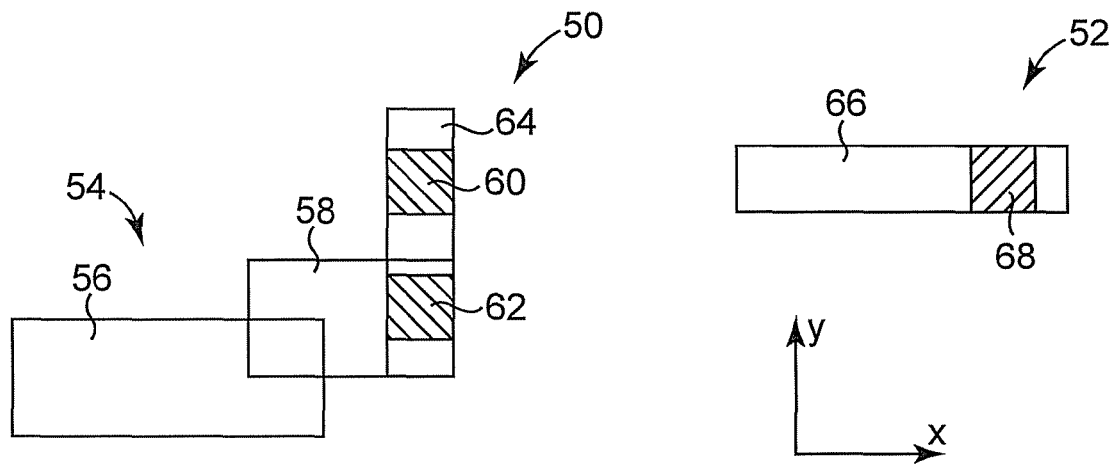
FIG. 3 illustrates example wire shapes of a router-provided wiring layout.

FIG. 3 illustrates two examples of original wire shapes of an incoming layout. A wide-line, complex shape is illustrated at 50 and a narrow-line, simple shape is illustrated at 52. Complex wire shape 50 includes a wire 54 having two overlapping wire shapes 56 and 58, and a pair of vias 60 and 62 (illustrated by the "hatched" areas) positioned on a wire shape 64. Simple wire shape 52 includes a wire 66 and a single via 68. It is noted that only the right-hand ends of wires 54 and 66 are shown in FIG. 3.

Figure 4:
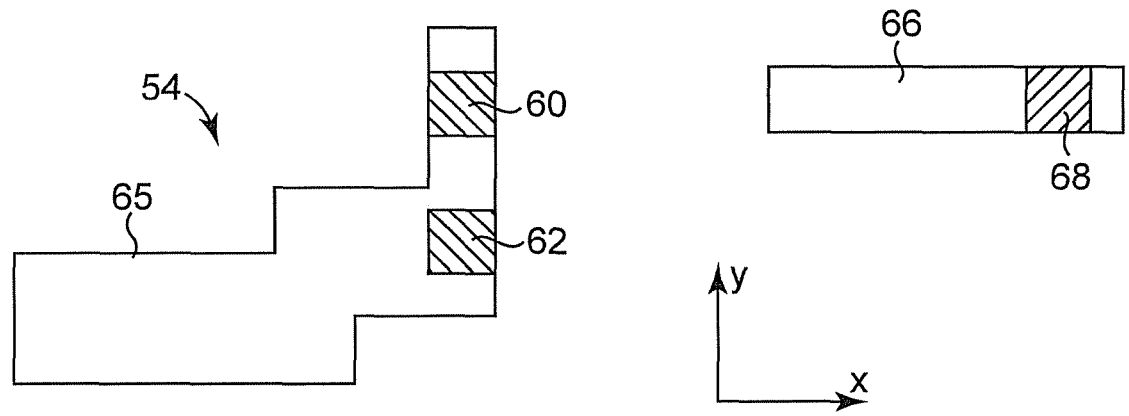
FIG. 4 illustrates modification of the shapes of FIG. 3 according to one embodiment.

According to one embodiment, as illustrated by FIG. 4, after reading the original wire shapes from the data base, overlapping and abutting wire shapes are "merged" to form polygons. For example, as illustrated by FIG. 4, wire shapes 56, 58, and 64 of wire 54 have been merged to form a single polygon shape or structure 65.

According to one embodiment, after overlapping and abutting shapes/structures have been merged to form polygon shapes, the incoming wire layout is "bricked" by segmenting the merged polygon shapes along a grid of equally spaced vertical grid (i.e. in the y-direction). The intersections of the merged shapes and the vertical grid lines segment the wires into what are referred to herein as "bricks", with a single wire being described as a consecutive series of abutting or connected bricks running horizontally (i.e. in the x-direction) from left-to-right through the vertical grid lines.

Figure 5:
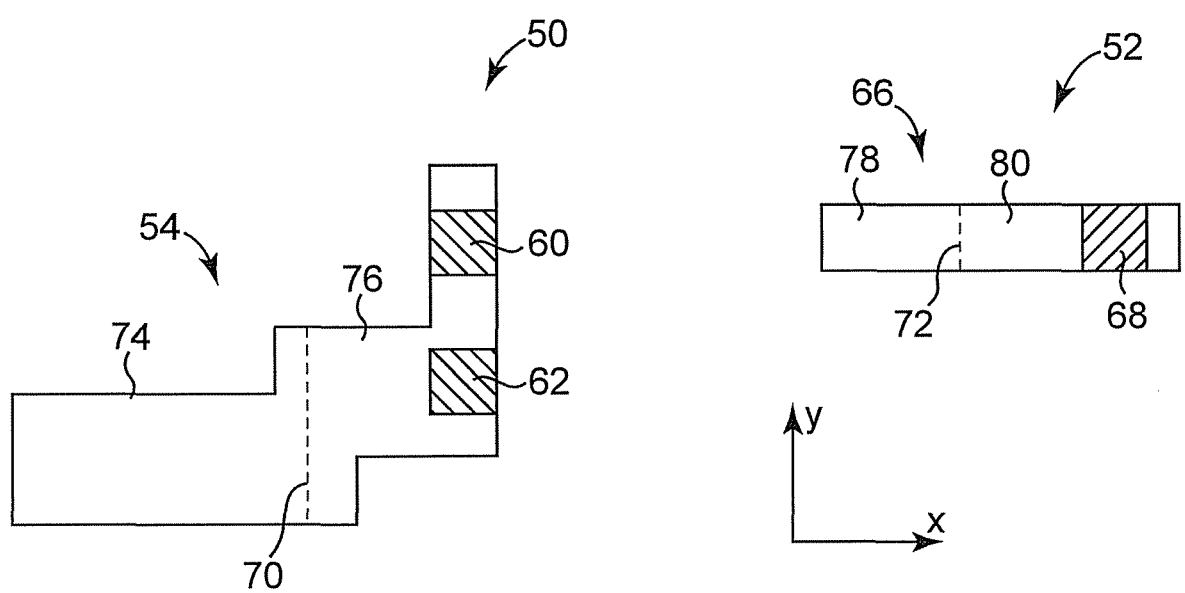
FIG. 5 illustrates modification of the shapes of FIG. 4 according to one embodiment.

FIG. 5 illustrates wires 54 and 66 of FIGS. 4-5 after being "bricked" by a set of vertical grid lines. Vertical grid lines are illustrated by the dashed lines at 70 and 72. As illustrated, wire 54 is segmented into bricks 74 and 76, and wire 66 is segmented into bricks 78 and 80.

In one embodiment, the vertical grid lines are equally spaced at a distance of five times (5×) a minimum wire width required by applicable design rules. In other words, in one embodiment, the wires are segmented into bricks having a 5:1 length-to-width ratio. Other ratios may be employed as desired. As will become apparent in the description herein, wires are "bricked" to provide flexibility to the wires in later repair/replacement and SFF processes. Shorter bricks (i.e. lower length-to-width rations) provide more flexibility but increase calculation requirements (i.e. increase the number of bricks), while longer bricks (i.e. higher length-to-width ratios) lessen calculation requirement but also provide less flexibility.

In one embodiment, after the incoming layout has been "bricked", via holes are identified and a via cluster shape (VCS) is formed about each via hole of the incoming layout. In one embodiment, each wire of the incoming layer is "searched" from its left-hand end to its right-hand end to identify all associated via holes. In some instances, two or more via holes are grouped together or "clustered" and a single VCS shape is formed about the cluster of via holes. The purpose of via clustering and example embodiments for forming via cluster shapes are described and illustrated below by FIGS. 6-12.

Figure 6:
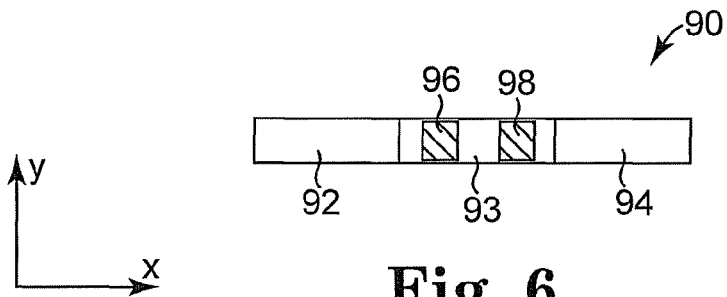
FIG. 6 illustrates an example of a via hole pair connected to a wire.

FIG. 6 is illustrates a wire 90, including bricks 92, 93 and 94, which is in-line and connects to a pair of vias 96 and 98. During a subsequent spreading and fattening processes (i.e. SFF), which will be described in greater detail below, an SFF process may reposition wire 90, including bricks 92, 93, and 94, so as to achieve a greater spacing from a neighboring wire (not illustrated in FIG. 6) or to maintain a minimum required spacing from a neighboring which has previously been reposition by the SFF process.

Figure 7:
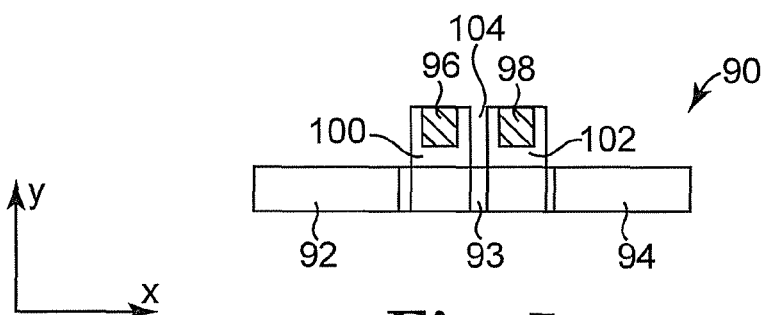
FIG. 7 illustrates the via hole pair of FIG. 6 after modification by a post processing technique.

An example of the movement of wire 90 by SFF is illustrated by FIG. 7 where wire 90 has been moved vertically downward (i.e. y-direction) relative to its position in FIG. 6. As a result, vias 96 and 98 are spaced from and no longer connected to wire 90 and, consequently, will need to be reconnected to wire 90 by the SFF process. In one embodiment, as illustrated, the SFF process respectively reconnects vias 96 and 98 to wire 90 using vertical connectors 100 and 102. As illustrated by FIG. 7, reconnecting the pair of vias 96 and 98 in this fashion may result in the formation of a gap 104 between vertical connectors 100 and 102. Depending on the horizontal spacing between the vias 96 and 98, gap 104 may be less than the minimum wire spacing required by the applicable design rules, thereby creating a potential litho hot spot or even a violation of a "hard" design rule.

Figure 8:
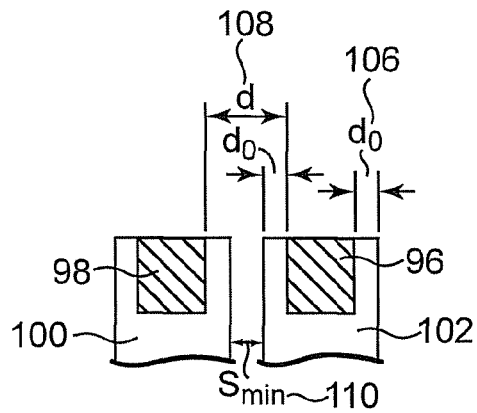
FIG. 8 illustrates the via hole pair of FIG. 6 according to one embodiment.

According to one embodiment, to avoid creation of such hot spots, via holes which are horizontally spaced from one another by a distance which is less than a required horizontal separation distance ($d_S$) are clustered so as to be treated as a single entity which must be reconnected to a wire using a single connector. FIG. 8 is an enlarged view of vias 96 and 98 of FIG. 7. As a general design practice, it is generally desirable to provide a metal overhang in at least one direction (e.g. horizontal or x-direction) on each side of a via hole, as illustrated by an overhang distance ($d_O$) at 106. The metal overhang allows for some amount of misalignment between IC layers. While providing a metal overhang in both the horizontal and vertical direction is desirable, free space between wires is typically limited in the vertical direction so that is difficult to consistently provide metal overhang in the vertical direction.

In view of the above, and as will be described below with regard to forming VCS shapes, according to one embodiment, if a horizontal via separation distance ($d_V$) 108 between two vias of a same wire, such as vias 96 and 98 of wire 92, is less than twice a desired horizontal metal overhang distance $d_O$ 106 plus a design rule required minimum spacing ($S_{MIN}$) 110, the vias will be clustered and a single VCS will be formed about the clustered vias. As such, the minimum required horizontal separation distance, $d_S$, between two vias is equal the twice the desired horizontal metal overhang distance $d_O$ 106 plus the design rule required minimum spacing $S_{MIN}$ 110 (i.e. $d_S=2(d_O)+S_{MIN}$).

Figure 9:
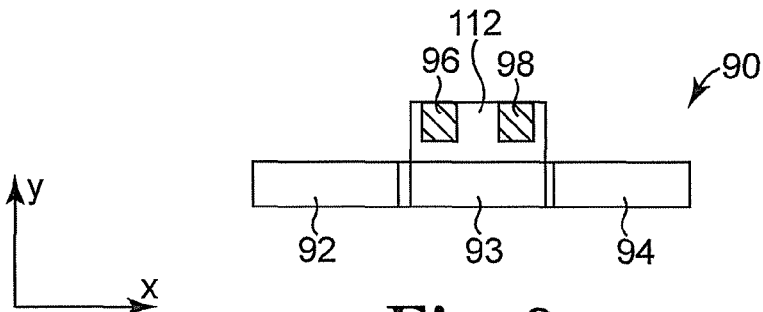
FIG. 9 illustrates a via cluster shape relative to the via hole pair of FIG. 6 according to one embodiment.

With reference to FIG. 9, assuming that horizontal via separation distance $d_V$ 108 between vias 96 and 98 is less than the minimum required horizontal separation distance $d_S$ (i.e. $d_V<d_S$), vias 96 and 98 are clustered and treated as a single entity which is connected to wire 90 using a single vertical connector 112. Jointly connecting vias 96 and 98 to wire 90 with single vertical connector 112 prevents the formation of gap 104 and eliminates a potential litho hot spot.

Figure 10:
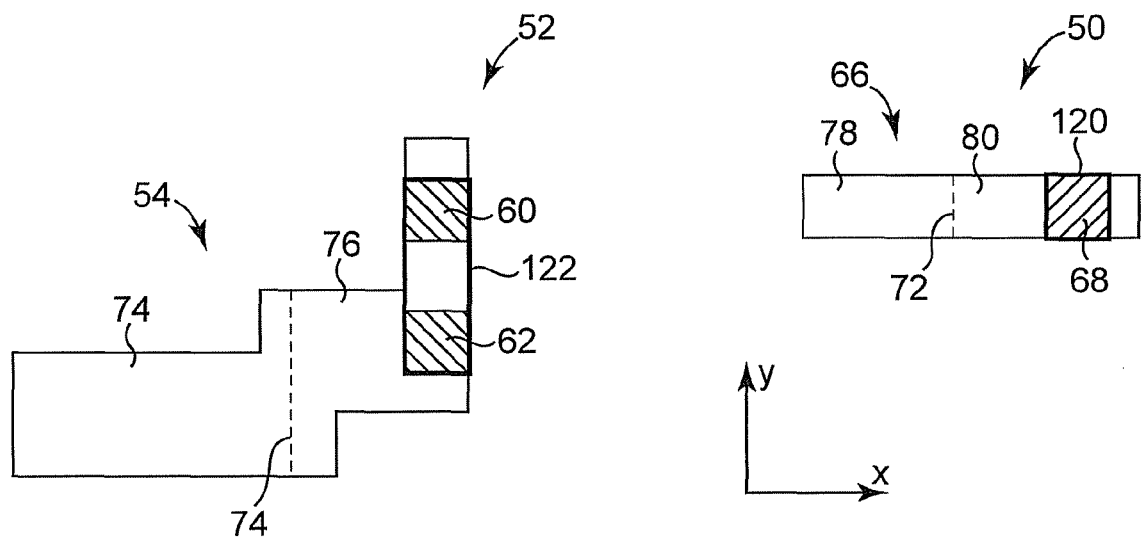
FIG. 10 illustrates via cluster shapes relative to the shapes of FIG. 5 according to one embodiment.
Figure 11:
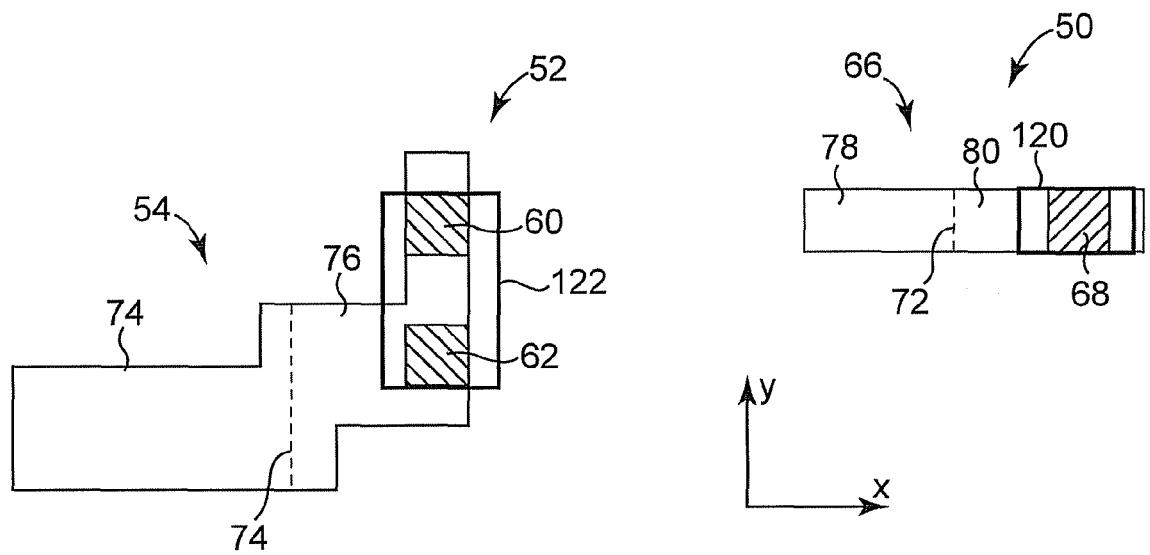
FIG. 11 illustrates via cluster shapes relative to the shapes of FIG. 10 according to one embodiment.
Figure 12:
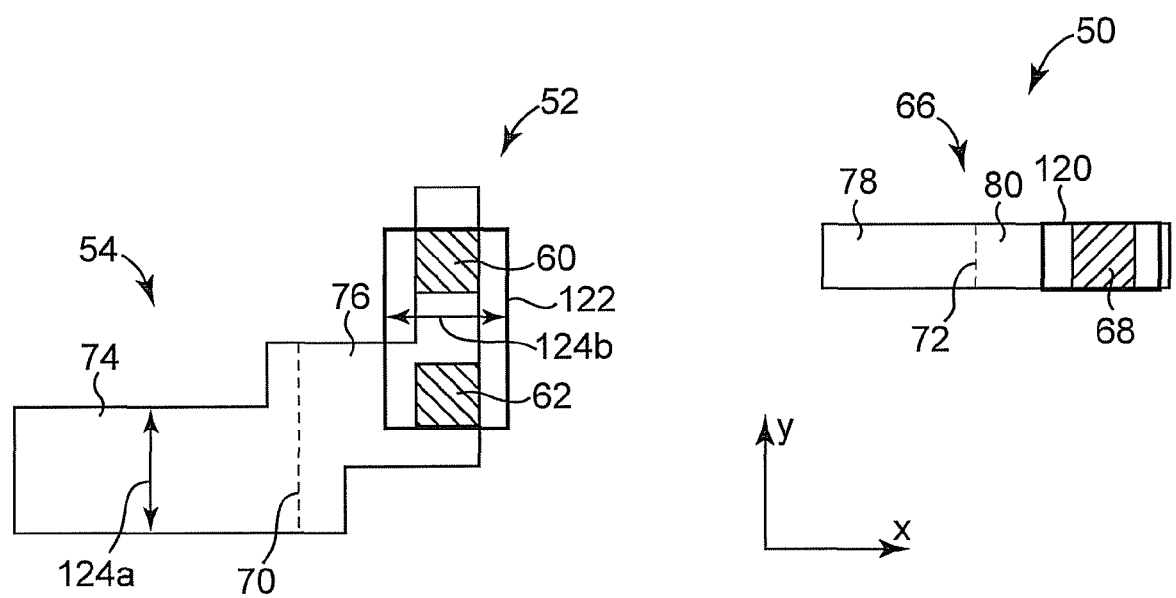
FIG. 12 illustrates via cluster shapes relative to the shapes of FIG. 11 according to one embodiment.

FIGS. 10-12 below illustrate embodiments of the formation of VCS shapes using vias 60, 62, and 68 of structures 52 and 54 of FIGS. 3 through 5 as examples. Referring to FIG. 10, vias 60 and 62 are vertically aligned such that there is no horizontal separation between them (i.e. $d_r=0$). Consequently, as described above, vias 60 and 62 will be clustered and a single VCS will be formed about vias 60 and 62, while a separate VCS will be formed about via 68. A VCS, as defined herein, is a metal shape that connects to a single via or to the two or more vias of a via cluster. In one embodiment, to reduce the potential creation of so-called ugly shapes, VCS shapes are rectangular in shape. In other embodiments, VCS shapes other than simple rectangular shapes may be employed.

In one embodiment, as illustrated by FIG. 10, to begin formation of VCS shapes, a VCS 120 comprising a simple rectangle having initial dimensions (illustrated by the bold rectangle) is formed about via hole 66, and a VCS 122 comprising a simple rectangle having initial dimensions (illustrated by the bold rectangle) is formed about clustered via holes 60 and 62. To begin, the initial dimensions of VCS rectangles are the minimum dimensions required to cover the associated via hole or vias of a via cluster. As such, VCS 120 has initial dimensions substantially equal to those of associated via hole 68, and VCS 122 has an initial horizontal dimension equal to a horizontal dimension of via holes 60 and 62 and an initial vertical dimension extending from an upper edge of via hole 60 to a lower edge of via hole 62. More generally, the initial VCS coordinates are dictated by the minimum and maximum x coordinates and the minimum and maximum y coordinates of any shape within the via cluster. In other words, the initial VCS is chosen as a "bounding box" around all shapes in a via cluster.

With reference to FIG. 11, in one embodiment, the horizontal dimension of VCS 120 is subsequently increased to provide a desired horizontal metal overhang distance $d_O$ 106 (see FIG. 8) on each side of via hole 66, and the horizontal dimension of VCS 122 is increased to provide the desired horizontal metal overhang on each side of via holes 60 and 62. By forming the VCS shapes as described above, a uniform horizontal metal via overhang is achieved whenever possible. In other embodiments, the metal overhang or overlap may also be achieved in the vertical direction, but as mentioned above, there is often insufficient room in the vertical direction due to neighboring wires. In other embodiments, a desired metal overhang distance may be different for up-vias (i.e. vias which connect metal "n" to metal "n+1") and down-vias (i.e. vias which connect metal "n" to metal "n−1").

In some cases, a horizontal dimension of a VCS may need to be further widened (i.e. in addition to the widening required to provide the desired horizontal via overhang) so as to match a required minimum width of a wire to which the associated via or vias are attached. In some cases, for instance, a wire to which a VCS is connected may be a power conductor or a clock wire, and may have a required width or lateral dimension that is greater than the minimum width required by the applicable design rules. For example, in one embodiment, as illustrated by FIG. 12, the horizontal dimension of VCS 122 is further widened, relative to FIG. 11, so as to match the width of wire 54 to which it is connected, as illustrated by dimensional arrows 124a, 124b.

For a via or via cluster which is positioned along a length of the wire somewhere between the right and left hand ends of the wire, this additionally widened VCS, such as VCS 122 of FIG. 11, is horizontally centered on the associated via or via cluster. However, for a via or via cluster at the left-end of a wire, the VCS may need to be placed at the rightmost possible position, and for a via or via cluster at the right-end of a wire, the VCS may need to be placed at the leftmost possible position.

According to one embodiment, after constructing VCS shapes about each via or via cluster of the incoming layout, "problematic" bricks are identified within the incoming wiring layout. Generally, problematic bricks are bricks which are not simple rectangles, such as bricks 74 and 76 of wire 54 of FIG. 10. These problematic bricks are referred to as "complex" bricks, in contrast to "regular" bricks (i.e. bricks having simple rectangular shapes). In other embodiments, complex bricks may be defined by additional criteria as well.

During subsequent processes, such as SFF processes and shape replacement processes, which will be described in greater detail below, portions of wires may be moved which may result in the creation of jogs. For example, if SFF processes are to be applied to the incoming wire layout, portions of wires comprising one or more bricks may be moved vertically (i.e. y-direction) to optimize spacing from neighboring wires while other portions may remain at their original positions. Vertical connectors or "jogs" are then inserted to reconnect relocated wire portions to one another and to those wire portions that remain at their original positions.

In some instances, it is undesirable to have jogs created between certain brick pairs. For example, in one embodiment, it is undesirable to have jogs closer than a desired distance to a wire end (e.g. a via or via holes). In one embodiment, the desired distance is at least equal to a brick length (e.g. 5× the minimum required wire width). It is also undesirable to have a jog less than the desired distance from a via hole (i.e. a VCS). Additionally, it is undesirable to have a jog less than the desired distance from a complex brick. Inserting vertical connectors between such brick pairs could result in the creation of complex or ugly shapes for lithography.

According to one embodiment, to avoid the insertion of jogs between such brick pairs, such as by SFF processes, these brick pairs are defined as groups. In one embodiment, all bricks of the incoming layout, both regular and complex bricks, are formed into groups. Groups are formed on a hierarchical level above the bricks. For example, a wire contains groups, and the groups contain bricks such that each brick is a component of only one group. Each group may contain any non-zero number of bricks, including just one brick. Groups containing at least one complex brick are identified as complex groups. Additionally, complex series are further defined from complex groups, with each complex series comprising one or more consecutive complex groups.

As will be described in greater detail below, such as by FIGS. 14-26, each complex group of each complex series which, by definition, are non-rectangular in shape, are attempted to be replaced with a simple rectangular candidate replacement shape in attempts to "repair" or "simplify" the original shape of the complex series. If a feasible position or path can be determined within the wire layout for the one or more candidate replacement shapes of each complex series (i.e. at least one position exists for each of the candidate replacement shapes which adheres to applicable design rules), the original bricks of the one or more complex groups of the complex series are deleted and replaced by the candidate replacement shapes. The candidate replacement shapes eliminate the non-rectangular shape of the complex series, with each candidate replacement shape being subsequently treated as a single entity by downstream processes, such as for spacing and fattening purposes by SFF processes (see FIGS. 26-29 below) As a result, jogs will not be inserted between bricks of a group, but only at group boundaries.

Similarly, groups not containing complex bricks but only one or more regular bricks (i.e. non-complex groups), are replaced with a simple rectangular replacement shape. However, since regular bricks are, by definition, simple rectangles, the replacement shape for such groups is a single simple rectangle having dimensions equal to that of the group and does not modify or simplify the shape. Although the replacement shape does not modify the shape of such groups, it too is treated as single entity, such as for spacing and fattening purposes by SFF processes (see FIGS. 26-29 below), so that, in essence, the regular bricks of such a non-complex group are fattened and spaced together and so that jogs will be inserted only at group boundaries.

As will be illustrated in greater detail below, by simplifying the shape of complex groups to be simple rectangles and by treating each group (both complex and non-complex) as a single entity during subsequent processes, such SFF processes, jogs are inserted only at group boundaries and the potential for the creation of additional complex or ugly shapes is reduced.

Returning to FIG. 12, bricks 74 and 76 of wire 54 are each non-rectangular and are defined as complex bricks, while bricks 78 and 80 of wire 66 are simple rectangles and defined as regular bricks. Additionally, the brick boundary between bricks 78 and 80 (i.e. at vertical grid line 72) is less than one brick length from VCS 120 (i.e. via hole 68), and the brick boundary between bricks 78 and 80 (i.e. at vertical grid line 70) is less than one brick length away from VCS 122 (i.e. via holes 60 and 62).

Figure 13:
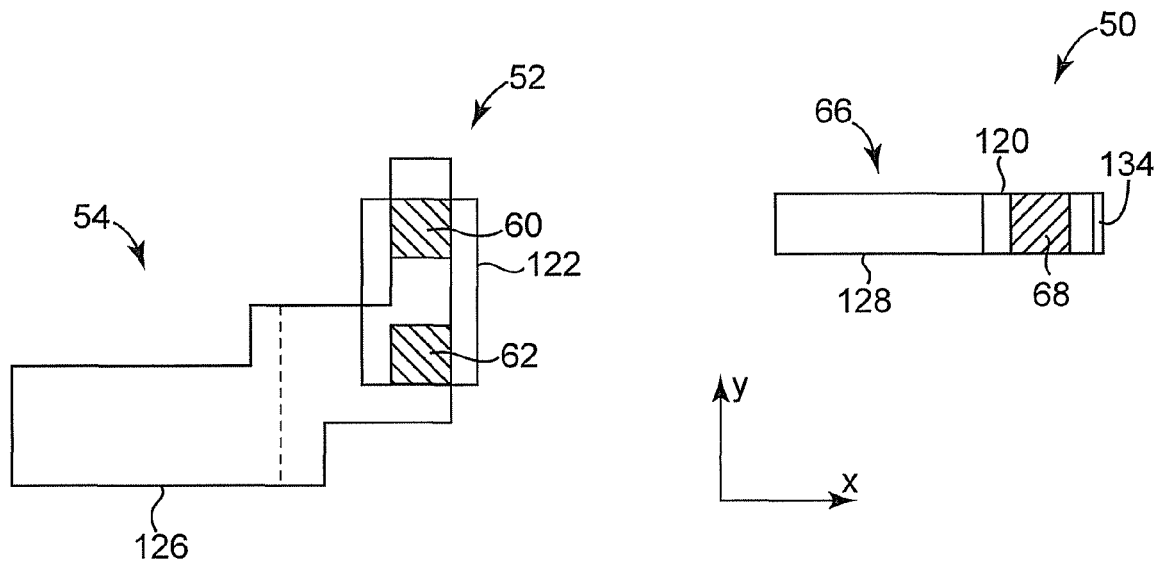
FIG. 13 illustrates modification of the shapes of FIG. 12 according to one embodiment.

As a result, with reference to FIG. 13, and in view of the above discussion, bricks 74 and 76 are grouped to form a group 126, and bricks 78 and 80 are grouped to form a group 128. Because at least one of the bricks 74 and 76 is a complex brick (in this instance, both bricks 74 and 76 are complex bricks), group 126 is further defined as a complex group. Additionally, group 126 is further defined as a complex series which, in this instance, is a complex series comprising one complex group.

Figure 14:
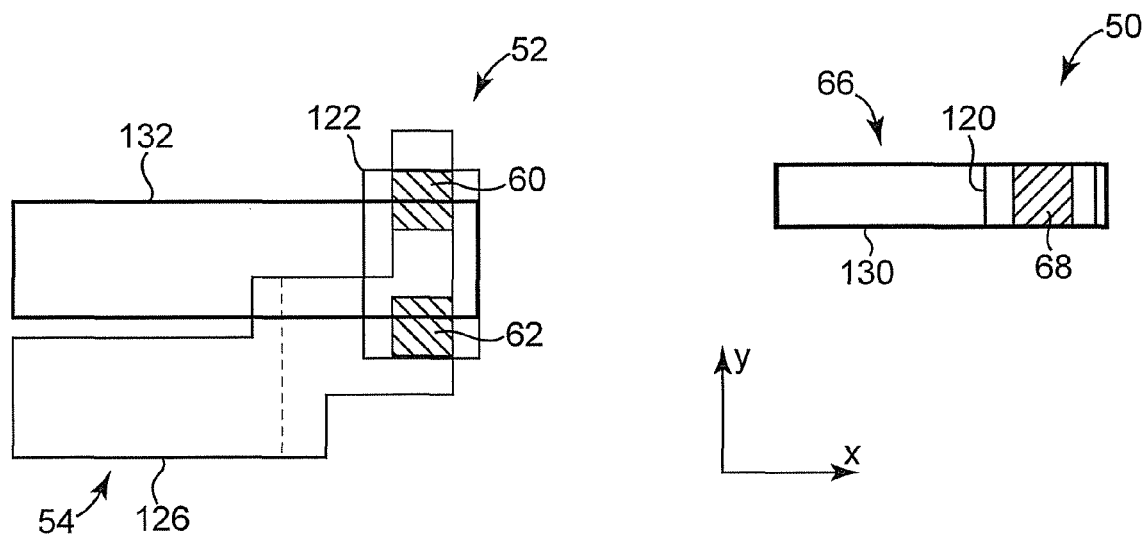
FIG. 14 illustrates example replacement shapes according to one embodiment.

Subsequently, with reference to FIG. 14, group 128 is replaced with a replacement shape comprising a simple rectangle having dimensions equal to that of group 128, as illustrated by the bold rectangle at 130. Additionally, according to one embodiment, as illustrated by FIGS. 13 and 14, wire ends extending beyond a VCS at which the wire terminates, such as wire end 134 at the right-hand end of wire 66, are "trimmed" so as to be flush with the edge of the VCS shape, such as the right-hand edge of VCS 120. As such, note that replacement shape 130 is flush with the right-hand end of VCS 120.

A candidate replacement shape comprising a single, simple rectangle, as illustrated by the bold rectangle 132, is proposed to replace or simplify complex group 126. While replacement shape 130 is placed at the same position as group 128, candidate replacement shape 132 is positioned or placed only at an arbitrary initial position in the vertical direction (i.e. y-direction). As will be described in greater detail below, candidate replacement shape 132 will be later placed at an optimal or final position if it is determined that a feasible path exists.

FIGS. 15-20 below illustrate an example of one embodiment for determining whether a feasible path exists for a candidate replacement shape, such as candidate replacement shape 132, and for positioning a candidate replacement shape at a final or optimal position. In one embodiment, as will be described in greater detail below, if an SFF process will be subsequently applied, optimal vertical positions for candidate replacement shapes, such as candidate replacement shape 132, as well as replacement shapes for other groups (non-complex groups), such as replacement shape 130, are subsequently determined by the SFF process.

Figure 15:
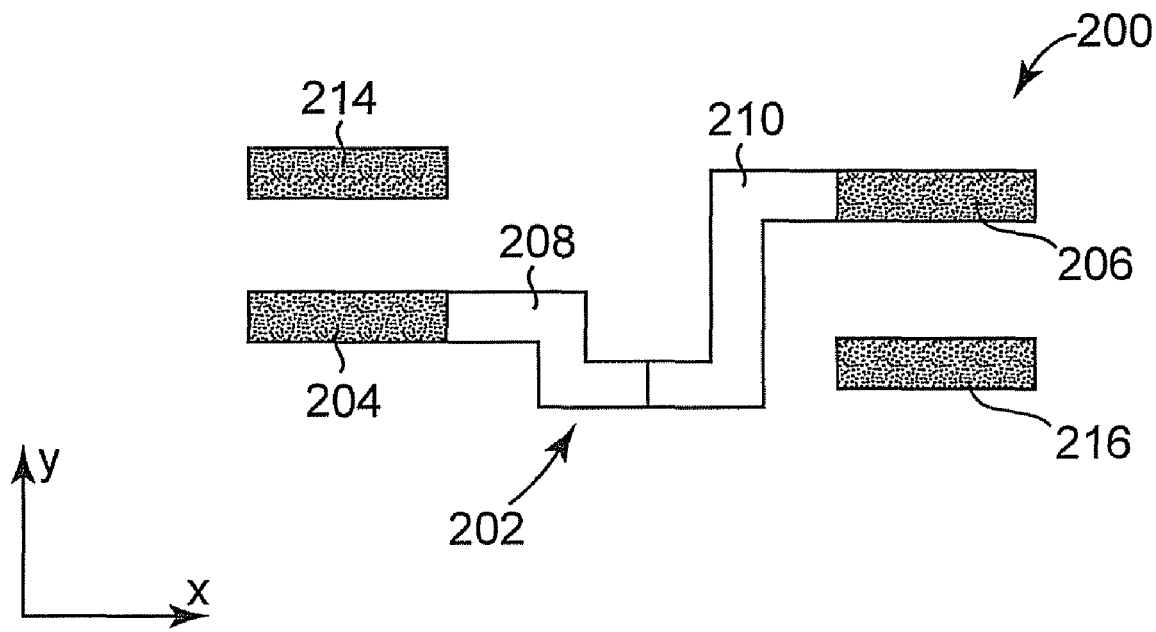
FIG. 15 illustrates an example of shape replacement according to one embodiment.

FIG. 15 illustrates a portion of an example wiring layout 200 including a wire 202. It is noted that wiring layout 200 is shown after being "bricked" by a vertical grid, as described above, such that wire 202 includes regular bricks 204 and 206 which are joined by complex bricks 208 and 210. Bricks 212 and 214 represent bricks of other wires or structures (e.g. fill structures) of wiring layout 200.

In the illustrated example, only a "middle" portion of wire 202 is shown and which is away from the left-hand and right-hand ends of wire 202. Since the boundary between complex bricks 208 and 210 is not at an undesirable position (e.g. is not within a brick's length of a via hole or wire end), complex bricks 208 and 210 are not grouped with one another as part of a single complex group. Instead, complex bricks 208 and 210 each represent a complex group containing a single complex brick. However, the complex groups formed by complex bricks 208 and 210 represent an example of a complex series of two consecutive complex groups.

Figure 16:
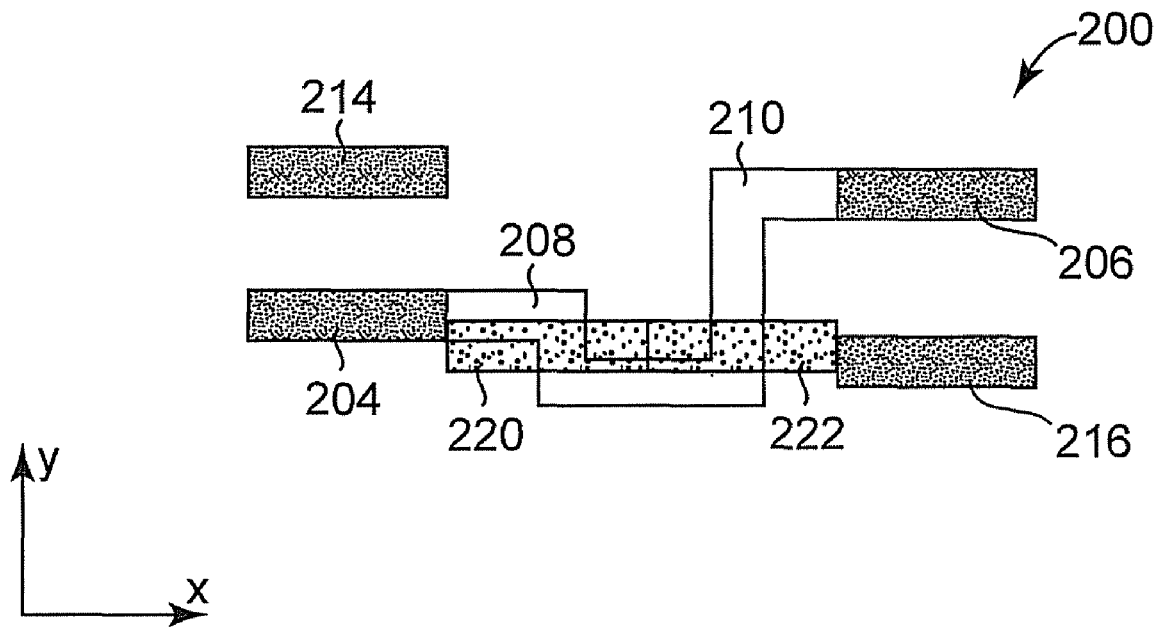
FIG. 16 illustrates an example of shape replacement according to one embodiment.

As such, with reference to FIG. 16, separate candidate replacement shapes 220 and 222 are respectively illustrated for complex bricks 208 and 210. While complex groups of a complex series each have separate and corresponding candidate replacement shapes, such candidate replacement shapes must together be able to form a feasible path in enable the candidate replacement shapes to replace the corresponding complex groups. As such, while candidate replacement shapes 220 and 222 can be independently positioned in the vertical direction (i.e. y-direction), they must together be able to form a feasible path between bricks 204 and 206 of wire 202 in order to replace complex bricks 208 and 210.

As such, according to one embodiment, in order determine whether a feasible path exists for the one or more candidate replacement shapes of a complex series to replace a portion of a wire, such as for complex groups 220 and 222 to replace a portion of wire 202 formed by complex bricks 208 and 210, the left-hand and right-hand endpoints or terminals of the corresponding wire at each end of the complex series are identified. Terminals may be wires (i.e. regular bricks) or a VCS at the end of a wire. In the illustrated example, bricks 204 and 206 respectively represent the left-hand and right-hand terminals at the ends of the portion of wire 202 proposed to be replaced by candidate replacement shapes 220 and 222.

Feasibility intervals are then defined for each of the candidate replacement shapes and for any associated vertical connectors that may be required. As will be illustrated and described below, feasibility intervals are defined as a range of "legal" positions (i.e. in accordance with the design rules being employed) at which the candidate replacement shapes and any required vertical connectors may be located.

Figure 17:
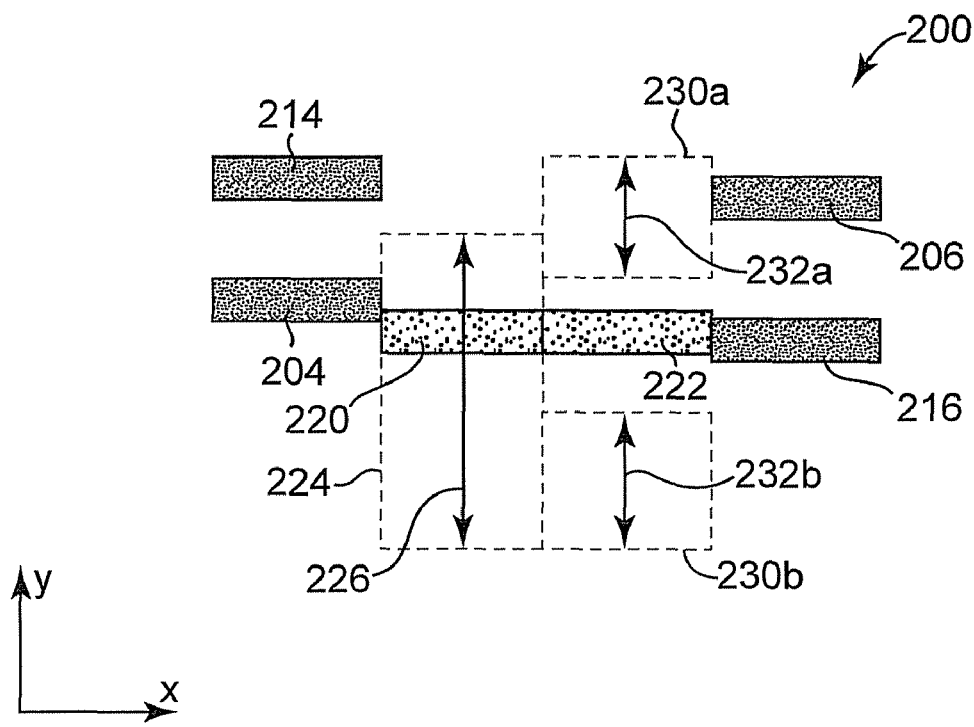
FIG. 17 illustrates an example of shape replacement according to one embodiment.

With reference to FIG. 17, and continuing the example of FIG. 16, a feasibility interval (FI) for candidate replacement shape 220 is illustrated by the dashed box at 224. The left-hand and right-hand boundaries of FI 224 are determined by the length of candidate replacement shape 220 which, in the illustrated example, is equal to a brick length (e.g. 5× the wire width). The upper and lower boundaries of FI 224 are determined by the design rules being employed with the upper boundary determined by the minimum required spacing from regular brick 214 and the lower boundary being determined by the required minimum spacing from another neighboring structure (not shown in FIG. 23). Candidate replacement shape 220 may be vertically positioned (i.e. y-direction) anywhere within FI 224, as illustrated by arrow 226.

Candidate replacement shape 222 has a split FI represented by dashed boxes 230a and 230b. The left-hand and right-hand boundaries of FIs 230*a* and 230*b* are determined by the length of candidate replacement shape 222. Similar to FI 224, the upper and lower boundaries of FIs 230*a* and 230*b* are dictated by design rule minimum spacing requirements, with the lower boundary of FI 230*a* and the upper boundary of FI 230*b* determined by the minimum required spacing from brick 216, and the upper boundary of FI 230*a* and the lower boundary of FI 230*b* determined by the required minimum spacing from neighboring structures (not shown in FIG. 23). Candidate replacement shape 222 may be vertically positioned (i.e. y-direction) anywhere within FIs 230*a* and 230*b*, as illustrated by arrows 232*a* and 232*b*.

It is noted that a field of search of the wiring layout to define FIs for candidate replacement shapes may be restricted to a reasonable distance above and below (i.e. y-direction) the complex groups being replaced.

Figure 18:
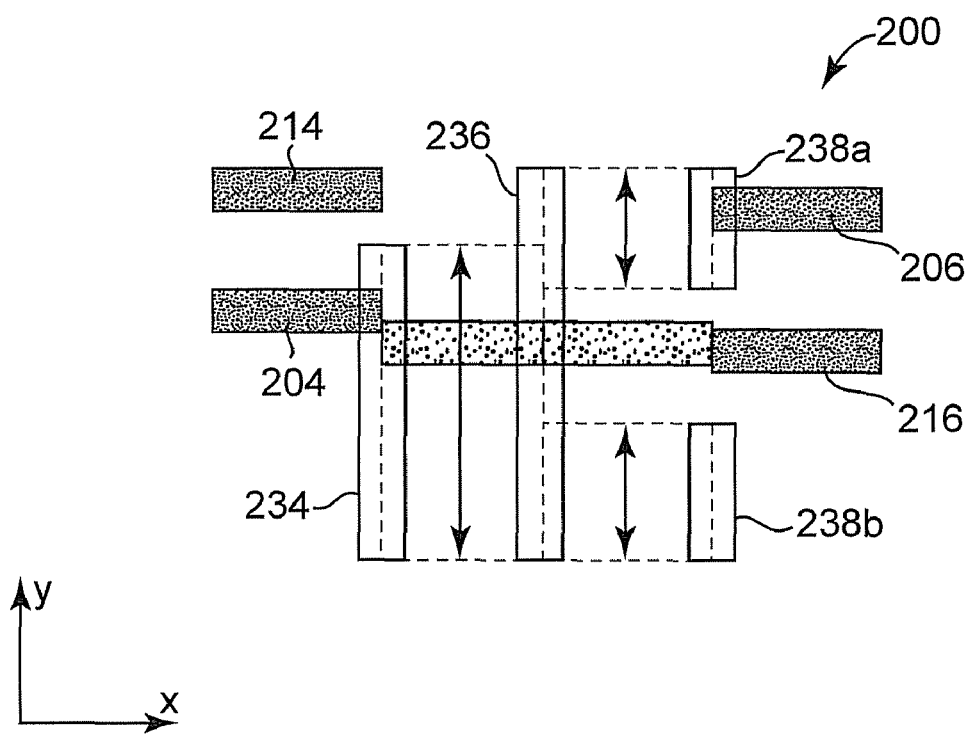
FIG. 18 illustrates an example of shape replacement according to one embodiment.

FIG. 18 illustrates feasibility intervals which must be similarly determined for vertical connectors which may be required to connect candidate replacement shapes 220 and 222 to one another and to left- and right-hand terminals 204 and 206 of wire 202. A FI for a potential vertical connector that may be required to connect candidate replacement shape 220 to left-hand terminal 204 is illustrated by the rectangle at 234. FI 234 has upper and lower boundaries determined by the upper and lower boundaries of FI 224 for candidate replacement shape 220.

A FI for a potential vertical connector that may be required to connect candidate replacement shapes 220 and 222 to one another is illustrated by the rectangle at 236. FI 236 has upper and lower boundaries determined by the upper boundary of FI 230*a* of candidate replacement shape 222 and a lower boundary determined by the lower boundary of FI 224 for candidate replacement shape 220.

A split FI for a potential vertical connector that may be required to connect candidate replacement shape 222 to right-hand terminal 206 is illustrated by rectangles 238*a* and 238*b*. FI 238*a* has upper and lower boundaries dictated by the upper and lower boundaries of FI 230*a*, and FI 238*b* has upper and lower boundaries dictated by the upper and lower boundaries of FI 230*b*.

The left-hand and right-hand boundaries of FIs 234, 236, 238*a*, and 238*b* are determined by the width of wire 202 (see FIG. 15). Potential vertical connectors may be placed anywhere within FIs 234, 236, 238*a*, and 238*b*. In FIG. 18, it is noted that the FIs for the vertical connectors are shown as being centered on the group boundaries. In other embodiments, the FIs vertical may be positioned at locations other than group boundaries.

Generally, the FI of a vertical connector is determined by the possible legal positions of a connector shape. A width (i.e. x dimension) of the connector is must at least be equal to the required minimum wire width. However, to improve the lithographic quality of the layout, it may be decided to use "recommended" rules for the construction of the FIs which are more conservative than minimum design rules. For example, a recommended rule may state that a distance or space between metal shapes shall be at least 1.5 times (1.5×) the minimum metal-to-metal spacing required by minimum design rules, and the width of a metal shape (i.e. orthogonal to the direction of current flow) shall be 1.5× the minimum width required by minimum design rules. Such "recommended" design rules are sometimes referred to as "relaxed" design rules.

According to one embodiment, after defining FIs for the candidate replacement shapes and for potential vertical connectors, "legal" or feasible paths for the candidate replacement shapes to follow through the corresponding FIs to connect the left-hand terminal to the right-hand terminal are identified. In one embodiment, such feasible paths are identified using what is typically referred to as a tree search.

Figure 19:
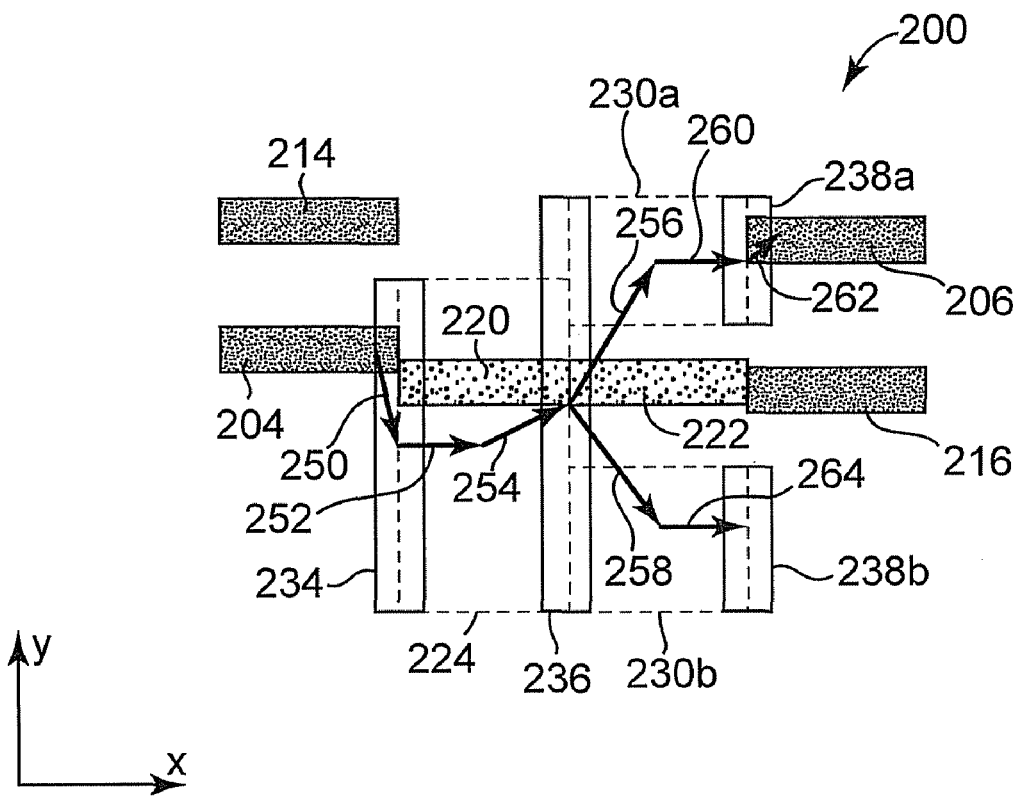
FIG. 19 illustrates an example of shape replacement according to one embodiment.
Figure 21A:
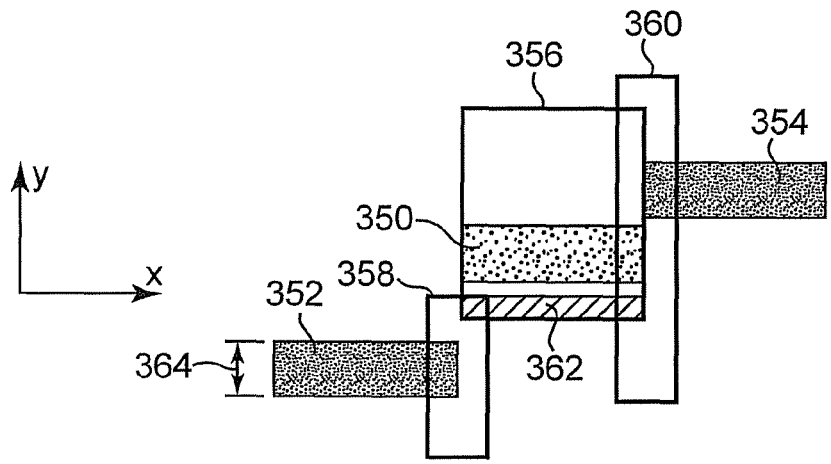
FIG. 21A illustrates an example of a non-feasible path for a candidate replacement shape according to one embodiment.
Figure 21B:
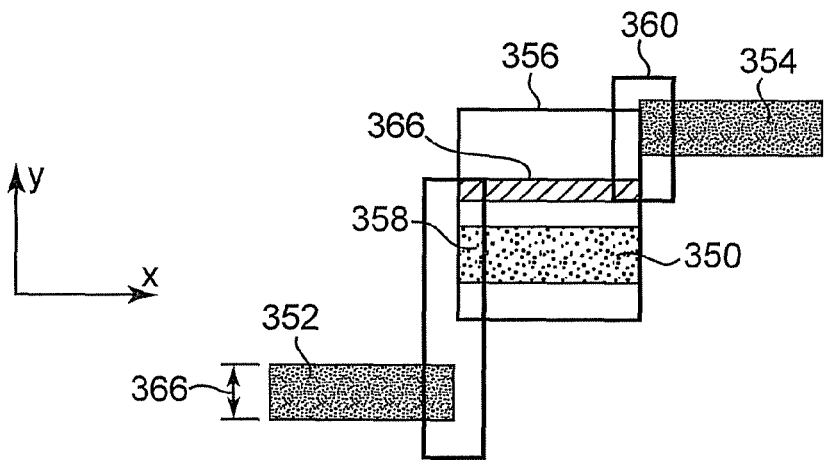
FIG. 21B illustrates an example of a non-feasible path for a candidate replacement shape according to one embodiment.
Figure 21C:
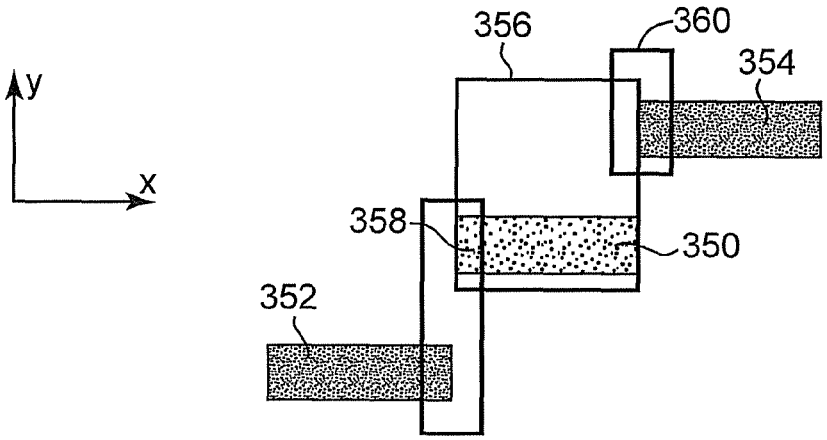
FIG. 21C illustrates an example of a non-feasible path for a candidate replacement shape according to one embodiment.

FIG. 19 continues the example of FIGS. 15-18 and illustrates one embodiment of a tree search for identifying legal or feasible paths for candidate replacement shapes 220 and 222 to follow to replace the portion of wire 202 formed by complex bricks 208 and 210. Starting at left-hand terminal 204 (i.e. regular brick 204), a path segment is identified to the center of FI 234, as indicated by the bold arrow at 250. This is because a legal path can be constructed from left-hand terminal 204 to a vertical connector with FI 234. In general, a so-called "legal" path can be constructed if the FIs have sufficient overlap in the vertical direction (i.e. y-direction). In one embodiment, a sufficient overlap comprises the minimum wire width required by the design rules, as illustrated by FIG. 18. Examples of non-legal paths are illustrated by FIGS. 21A through 21C below.

With continued reference to FIG. 19, since a legal path can similarly be constructed from any vertical connector within FI 234 to any candidate brick within FI 224, a next path segment is identified to the center of FI 224, as illustrated by the bold arrow at 252. From the center of FI 224, a next path segment is identified to the center of FI 236, as illustrated by the bold arrow at 254. From the center of FI 236, two path segments are identified, one running to the center of FI 230*a* as illustrated by bold arrow 256, and another running to the center of FI 230*b* as illustrated by bold arrow 258.

From the center of FI 230*a*, a path segment is defined to the center of FI 238*a* as illustrated by bold arrow 260. A next path segment is identified from the center of FI 238*a* to right-hand terminal 206 (i.e. regular brick 206) as illustrated by bold arrow 262. From the center of FI 230*b*, a next path segment is identified to the center of FI 238*b*, as illustrated by bold arrow 264. From the center of FI 238*b*, no additional "legal" path segments can be identified, as a path segment cannot be identified from the center of FI 238*b* to right-hand terminal 206 without creating a design rule violation with respect to regular brick 216.

With reference to FIG. 19, only one legal path is identified from left-had terminal 204 to right-hand terminal 206, as identified by the series of bold arrows 250, 252, 254, 256, 260, and 262. A second path, identified by bold arrows 250, 252, 254, 258, and 264, dead-ends at FI 238*b* and is, thus, not a legal path. For each legal path, it must also be determined if the candidate replacement shapes can be connected by vertical connectors to all vias and/or via clusters (for examples, refer to FIGS. 26-29). Legal paths which enable connections from the candidate replacement shapes to vias and/or via clusters are considered feasible paths. Legal paths which do not fulfill this requirement are rejected. With respect to the example of FIG. 19, candidate replacement shapes 220 and 222 are not required to connect to any vias and/or via clusters so that the legal path represented by bold arrows 250, 252, 254, 256, 260, and 262 is considered a feasible path.

If no feasible paths are identified for the one or more candidate replacement shapes of a complex series, the candidate replacement shapes are discarded and the bricks of the complex group or complex series are retained and the original shape of the wire is maintained. For example, if no feasible path had been identified by the example tree search of FIG. 19, the original path of wire 202 formed by complex bricks 208 and 210 (see FIG. 15) would be retained and would not be replaced by candidate replacement shapes 220 and 222.

If at least one feasible path is identified, the complex bricks of the complex series are deleted and replaced by the one or more candidate replacement shapes. According to one embodiment, if more than one legal or feasible path exists, a "best" of the feasible paths is selected based on one or more criterion such as a minimum path length, a minimum number of corners or jogs, and maximum amount of free space about the candidate replacement shapes and associated vertical connectors, for example. In the example of FIG. 19, there is only one feasible path so that the feasible path represented by bold arrows 250, 252, 254, 256, 260, and 262 is also selected as the best feasible path.

After selecting the best feasible path, the candidate replacement shapes are placed at a vertical position within their respective FI along the selected feasible path. If an SFF process is to be later applied to the wiring layout, an initial vertical position within the FI at which each of the candidate replacement shapes is placed is arbitrary, and the final or optimal vertical position will be determined by the SFF process. In one embodiment, if an SFF process is to be later applied to the wiring layout, the candidate replacement shapes are placed at an initial vertical position which is at a center of their respective FI.

If an SFF process will not be later applied to the wiring layout, the candidate replacement shapes are vertically positioned within their respective FI based on one or more criterion such as minimizing the path length, minimizing the number of corners or jogs, and maximizing the amount of free space about the candidate replacement shapes and associated vertical connectors, for example.

Figure 20:
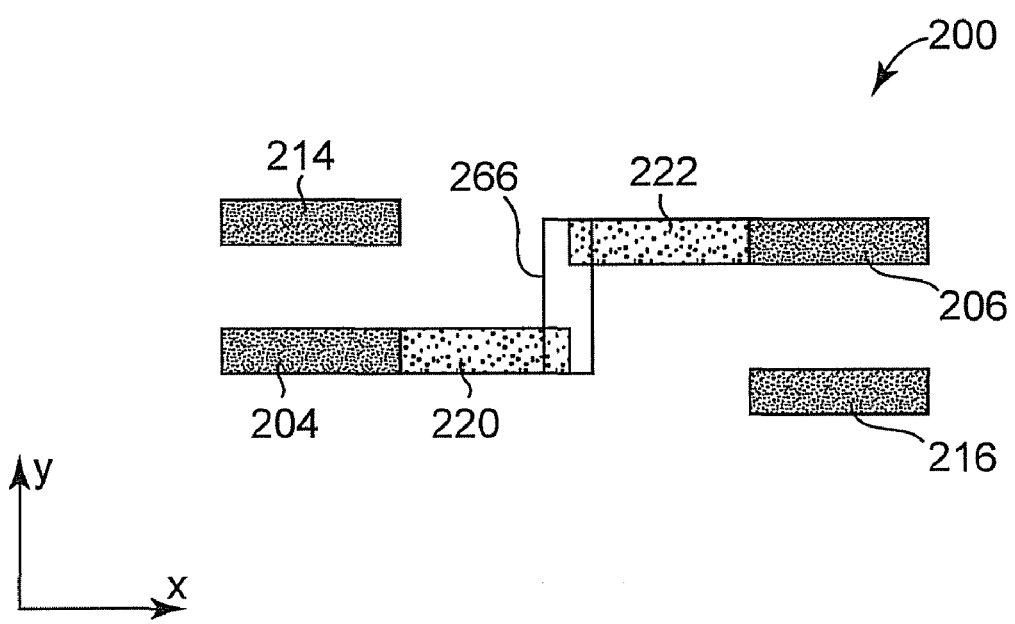
FIG. 20 illustrates an example of shape replacement according to one embodiment.

FIG. 20, which continues the example illustrated by FIGS. 15 through 19, illustrates an example where an SFF process will not be subsequently performed. As such, candidate replacement shapes 220 and 222 are not placed at arbitrary vertical positions within their respective FIs but, instead, are placed at vertical positions based on one or more criteria such as minimizing a length of the feasible path, minimizing a number of jogs in the feasible path, and maximizing an amount of free space or critical area between the candidate replacement shapes and associated vertical connectors and neighboring structures or wires, for example. For example, as illustrated by FIG. 20, the vertical positions of candidate replacement shapes 220 and 222 are selected so as to respectively align with bricks 204 and 206, thereby minimizing the number of jogs in the feasible path.

Although FIGS. 15-20 above illustrate an example for determining a feasible path a complex series containing two complex groups, it is apparent that the above described process can be readily applied to a complex series comprising a single complex group and more than two complex groups. FIGS. 26-29 below illustrate additional examples of complex groups and series to which the above described process for determining a feasible path may be applied.

FIGS. 21A through 21C illustrate examples of where a feasible path does not exist for a candidate replacement shape 350 (indicated by the "filled" rectangle) to connect between bricks 352 and 354. Bold rectangle 356 represents the FI (feasibility interval) for candidate replacement shape 350, and bold rectangles 358 and 360 respectively represent FIs for vertical connectors which may be required to connect candidate replacement shape 350 to bricks 352 and 354.

In FIG. 21A, a feasible or legal path cannot be constructed between bricks 352 and 354 because a vertical overlap (y-direction) between FIs 356 and 358, indicated by the hatched region at 362, is less than the wire width of bricks 352 and 354, as indicated at 364. Similarly, in FIG. 21B, a legal path cannot be constructed between bricks 352 and 354 because a vertical overlap between FIs 356 and 360, indicated by the hatched region at 366, is less than wire width 364. In FIG. 21C, a legal path cannot be constructed between bricks 352 and 354 because there is no vertical overlap between FIs 356 and 358.

Figure 22:
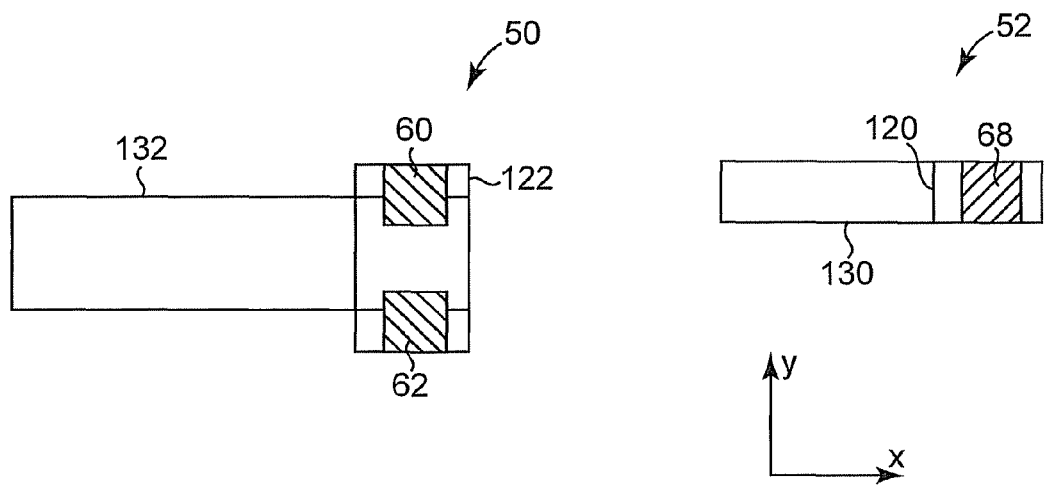
FIG. 22 illustrates an example of shape replacement of the example shapes of FIG. 14 according to one embodiment.

FIG. 22 returns to the on-going example of replacement shapes 130 and 132 of FIG. 14. In FIG. 22, it is assumed that a feasible path has been identified for candidate replacement shape 132 using techniques similar to those described above by FIGS. 15-20. As a result, candidate replacement shape 132 is no longer a "candidate" replacement shape so that the portion of original wire 54 comprising bricks 74 and 76 has been deleted and replaced by replacement shape 132. In the example of FIG. 14, it is further assumed that a subsequent SFF process will be employed so that replacement shape 132 is illustrated at only an arbitrary position within its corresponding feasibility range (not shown in FIG. 22). A final or optimal vertical position for replacement shape 132, as well as for replacement shape 130, will be determined by the SFF process.

As described earlier, SFF processes are employed to increase the lateral dimension or widths of wires, or portions of wires, of a wire layout and to increase spacing of wires, or portions of wires, from neighboring wires or structures of a wire layout. For example, in one embodiment, space-permitting, an SFF process may widen wires, or portions of wires, which are at a minimum width as required by applicable design rules, so as to have a width of 120% of the required minimum width. Similarly, in one embodiment, an SFF process may reposition or move wires, or portions of wires, to increase spacing from neighboring structures to a distance greater than a minimum spacing required by applicable design rules. For example, in one embodiment, an SFF process repositions wire, or portions of wire to optimize the so-called critical area between neighboring wires or portions of neighboring wires. In one embodiment, for example, an SFF process may reposition a wire so as to be substantially centered between neighboring wires on each side. An example of an SFF process is described by U.S. Patent Publication No. 2008/0010934, entitled "Method and Apparatus For Automatic Routing Yield Optimization".

Figure 23:
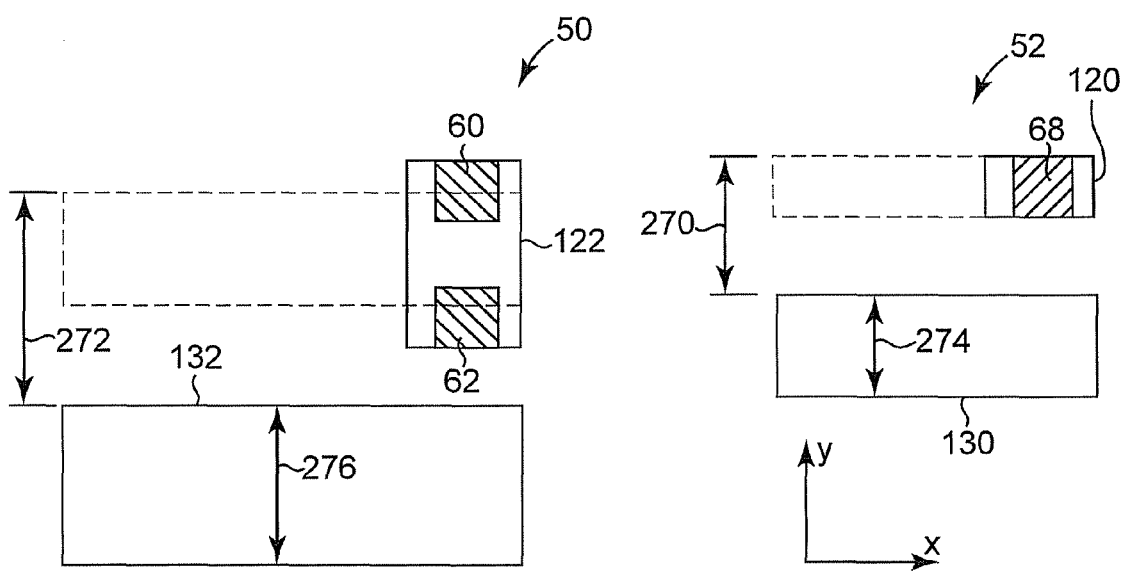
FIG. 23 illustrates an example of widening and spacing of the example shapes of FIG. 22 according to one embodiment.
Figure 24:
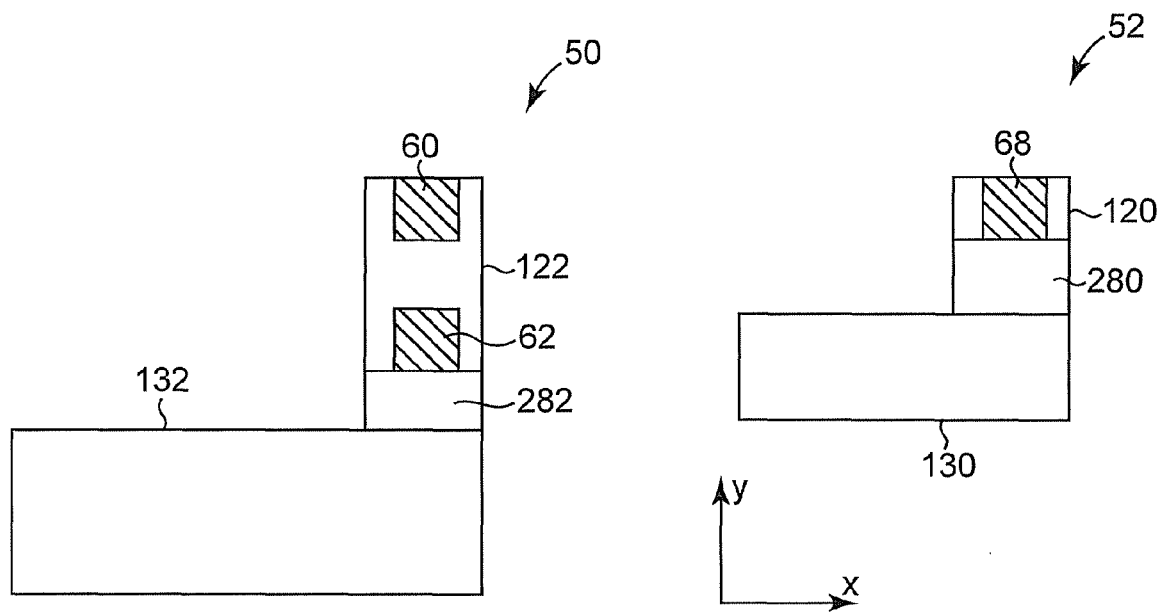
FIG. 24 illustrates an example of widening and spacing of the example shapes of FIG. 23 according to one embodiment.

FIGS. 22 through 24 below illustrate an example of the operation of the SFF process with regard to replacement shapes 130 and 132 of FIG. 14. FIG. 23, relative to FIG. 14, illustrates replacement shapes 130 and 132 as having been moved downward or "spaced" (i.e. y-direction) relative to VCS shapes 120 and 122 (which remain at fixed positions) by an SFF process to optimal positions which achieve optimal spacing (e.g. optimize critical area) from neighboring structures (not shown), as indicated by directional arrows 270 and 272. Replacement shapes 130 and 132 are also illustrated as having been widened or "fattened" (i.e. wire width increased) by the SFF process, as indicated by arrows 270 and 272.

Figure 25:
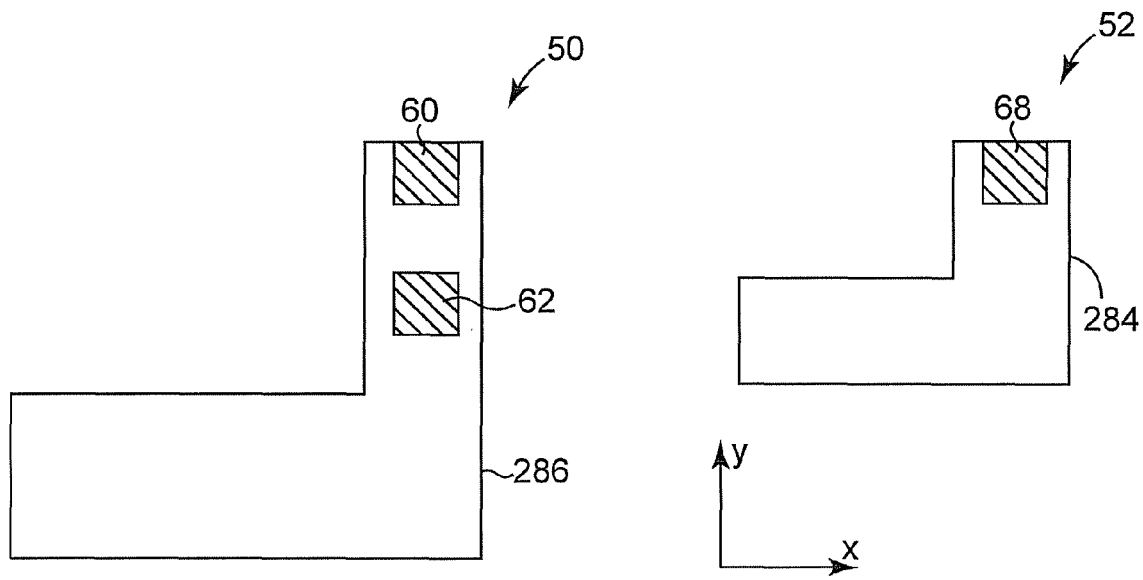
FIG. 25 illustrates an example of widening and spacing of the example shapes of FIG. 24 according to one embodiment.

FIG. 24 illustrates vertical connectors 280 and 282 inserted by the SFF process to connect candidate replacement shapes 130 and 132 to corresponding VCS shapes 120 and 122. FIG. 25 illustrates the merging of VCS 120, candidate replacement shape 130, and vertical connector 280 to form a single polygon shape 284, and the merging of VCS 122, candidate replacement shape 132, and vertical connector 282 to form a single polygon shape 286, so as to reduce data requirements.

FIGS. 25-29 below illustrate additional examples of grouping and candidate replacement shapes according to embodiments described herein, with "hatched" and "shaded" squares in each figure respectively representing down-vias and up-vias. FIG. 26A illustrates a portion of an incoming wire layout 300 after being "bricked", as described above, with vertical lines representing boundaries between consecutive bricks. Examples of complex and regular bricks are respectively illustrated at 302 and 304.

Figure 26A:
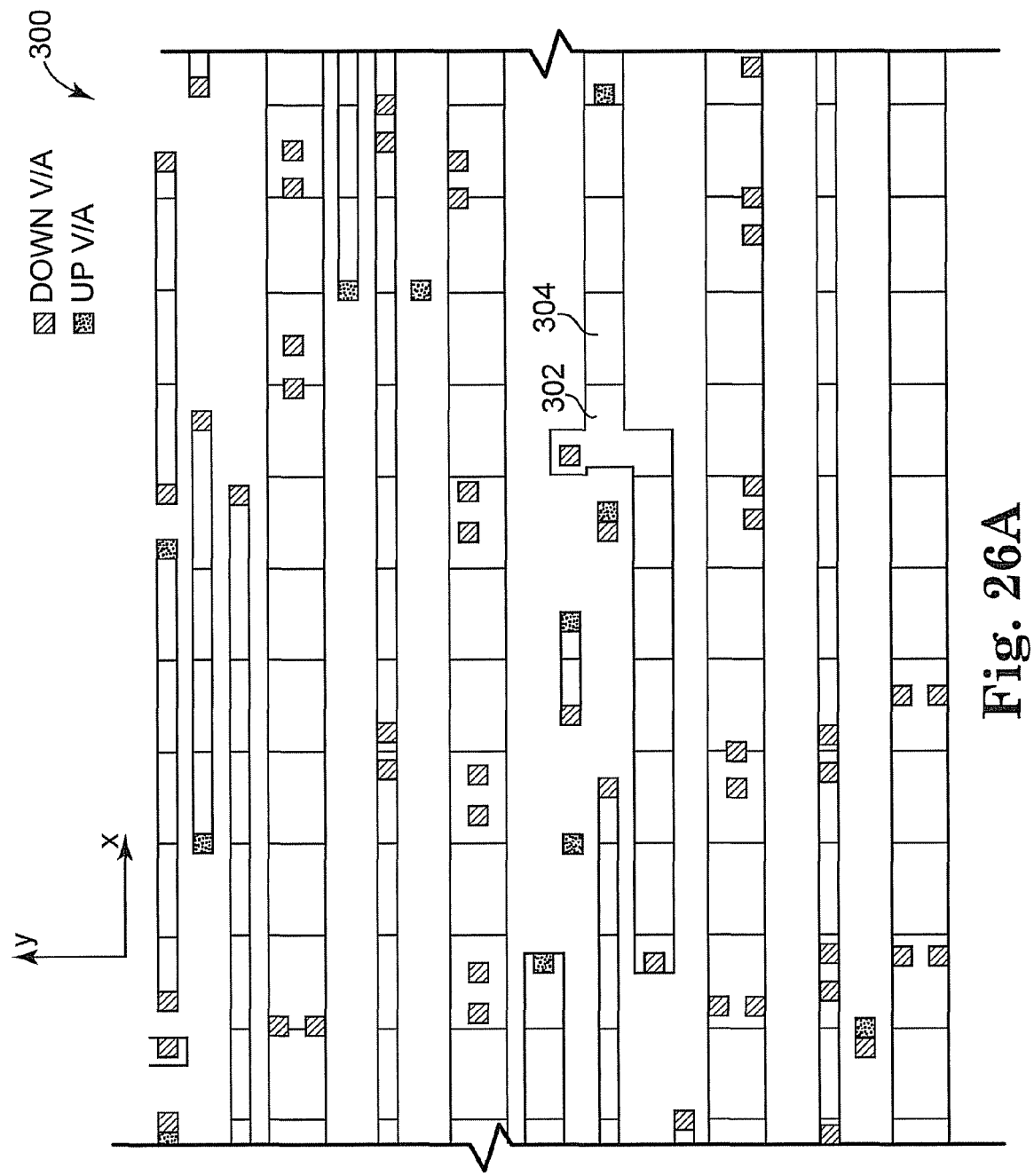
FIG. 26A illustrates an example of an incoming wire layout after being "bricked" according to one embodiment.
Figure 26B:
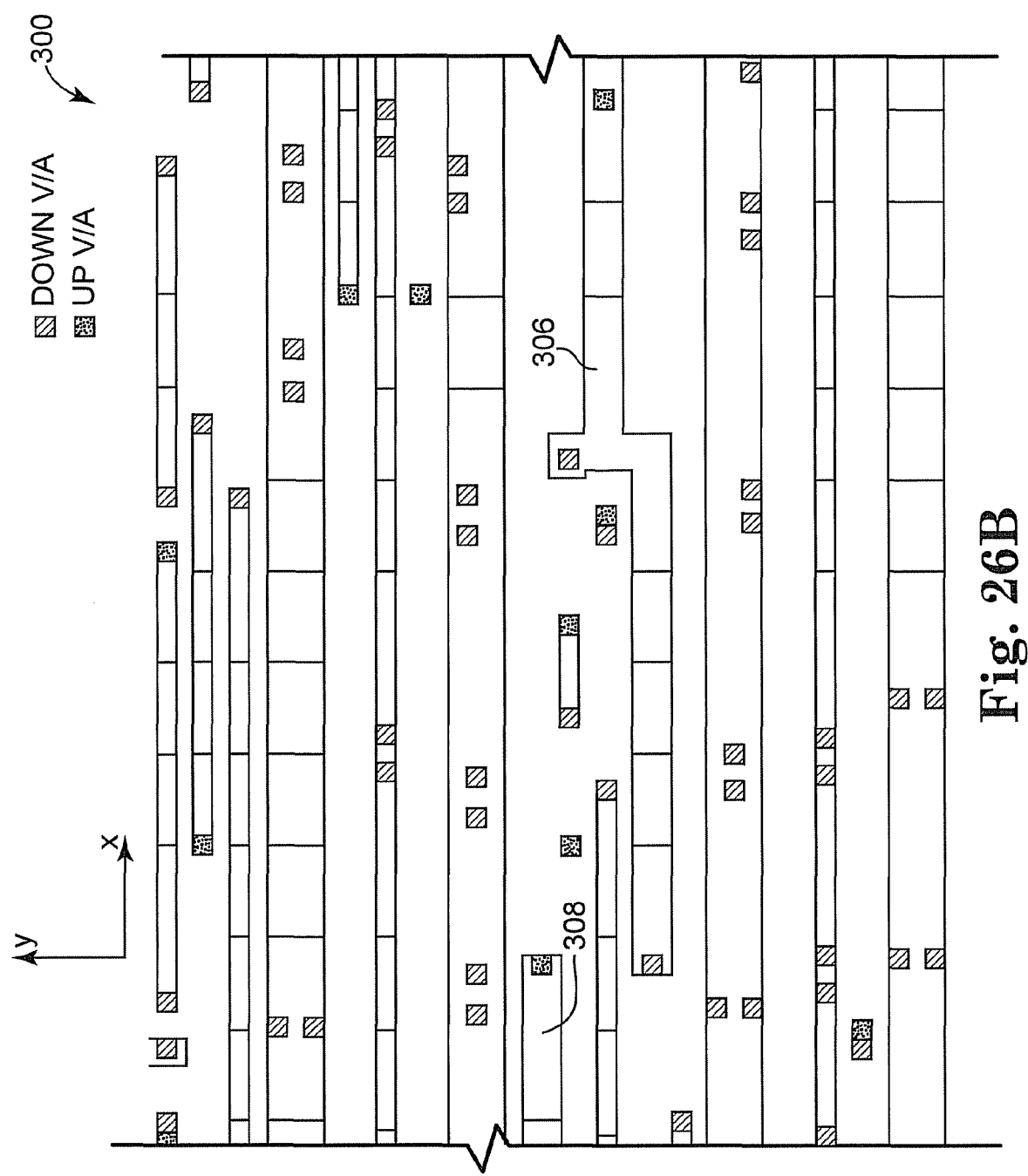
FIG. 26B illustrated the incoming wire layout of FIG. 26A after being "grouped" according to one embodiment.

FIG. 26B illustrates the incoming wire layout 300 of FIG. 15A after the bricks have been formed into groups. When comparing wire layout 300 of FIG. 26B to that of FIG. 26A, the absence of vertical lines indicate groups containing multiple bricks. For example, a complex group is illustrated at 306 and a group containing multiple regular bricks (i.e. a non-complex group) is illustrated at 308. The remaining vertical lines represent boundaries between groups and represent locations at which the SFF may insert vertical connectors. Note that the group boundaries are located away from wire ends and vias in order to avoid the creation of problematic and ugly shapes.

Figure 27:
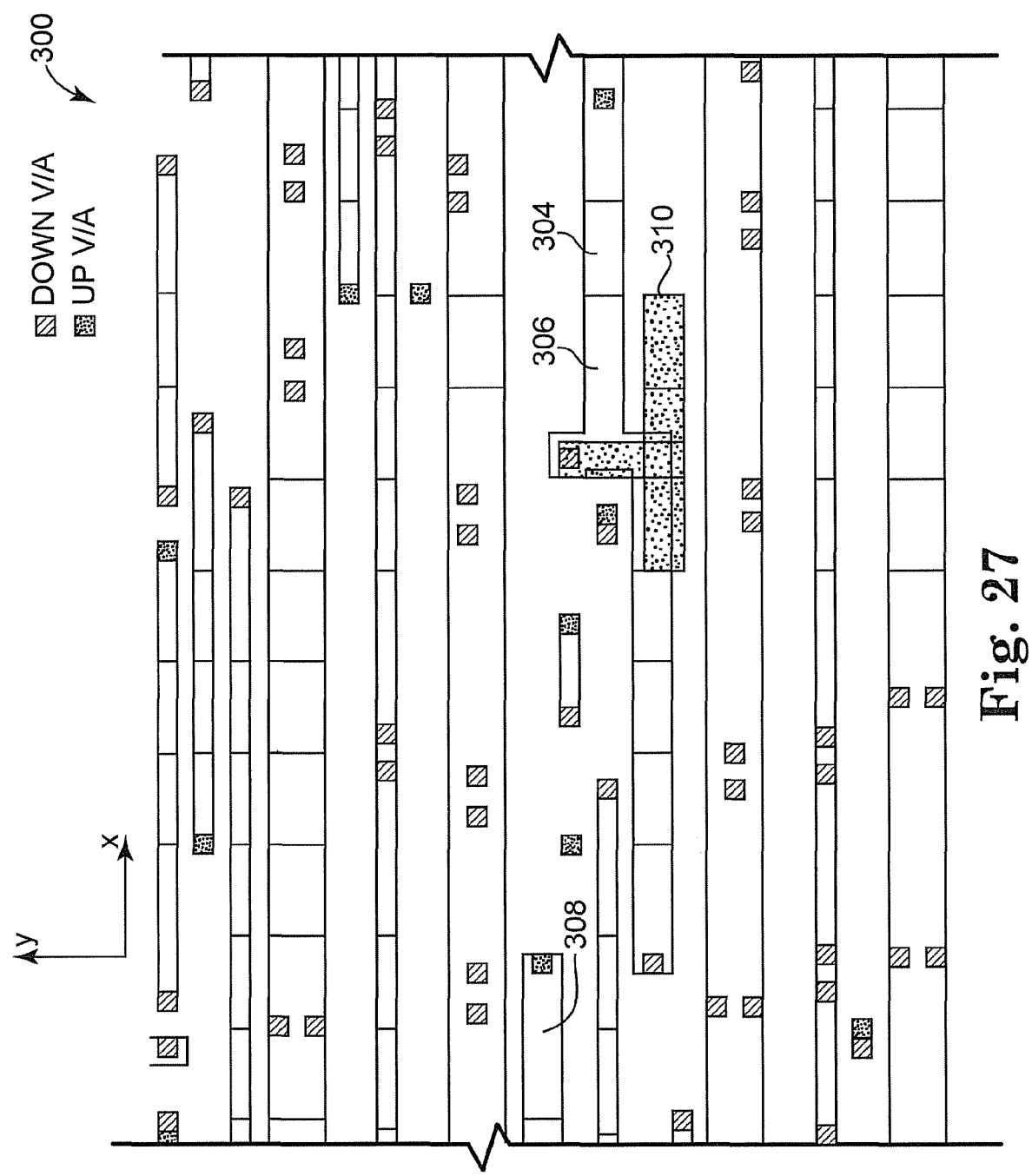
FIG. 27 illustrates an example of a replacement shape according to one embodiment.
Figure 28:
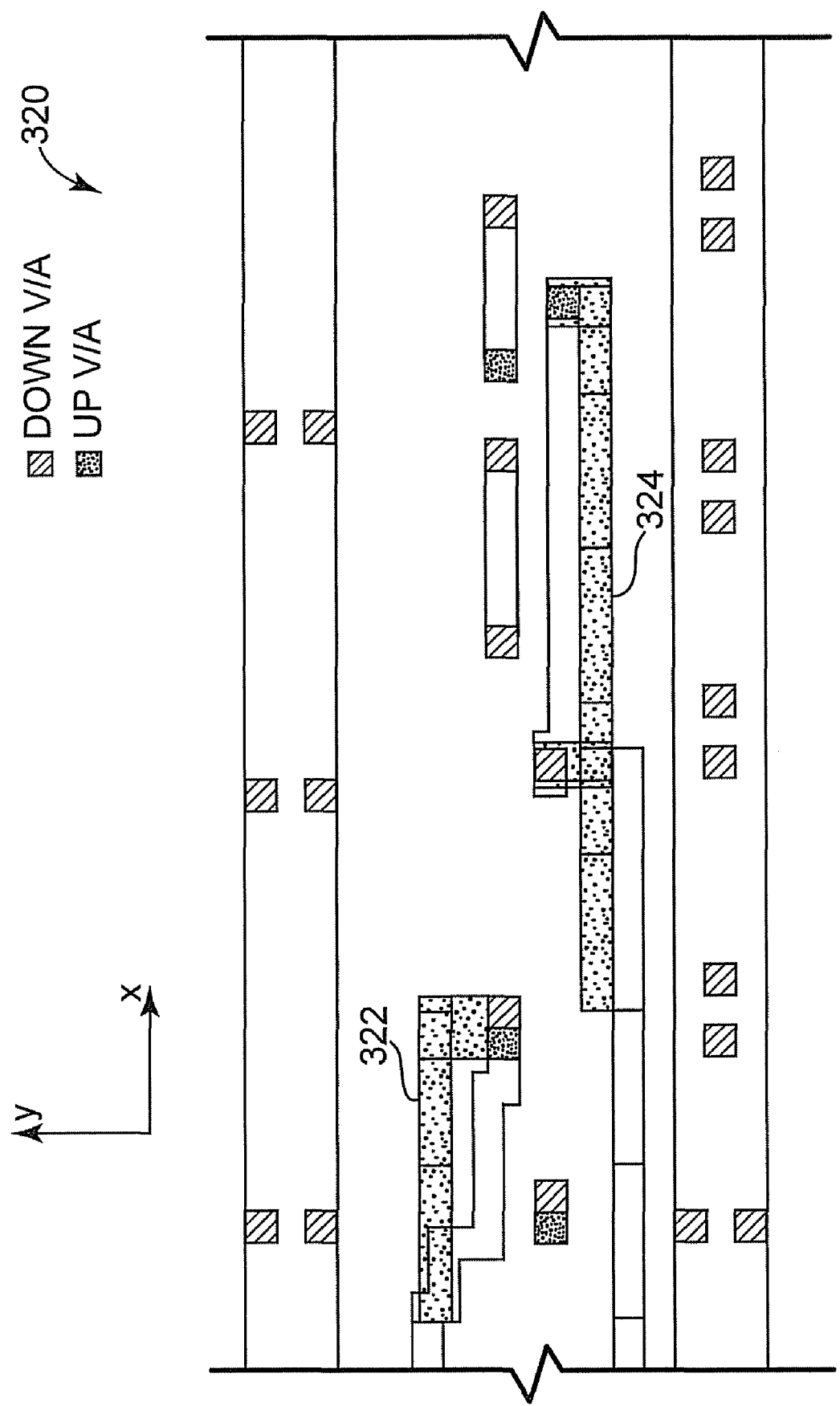
FIG. 28 illustrates an example of replacement shapes according to one embodiment.

FIGS. 27 through 30 show portions of incoming wiring layouts and illustrate examples of replacement shapes for complex groups. In each case, the replacement shape is illustrated by "shaded or filled" rectangles and is shown only at a feasible vertical position, with the final or optimal vertical position to be later determined by an SFF process. FIG. 27 illustrates a replacement shape 310 for complex group 306 of wire layout 300 as illustrated by FIG. 26B. FIG. 28 shows a portion of an incoming wire layout 320 and illustrates replacement shapes 322 and 324 positioned proximate to their corresponding complex group. Replacement shapes 332 and 324 illustrate replacement shapes for "large" groups, with the corresponding complex groups each containing at least three bricks.

Figure 29:
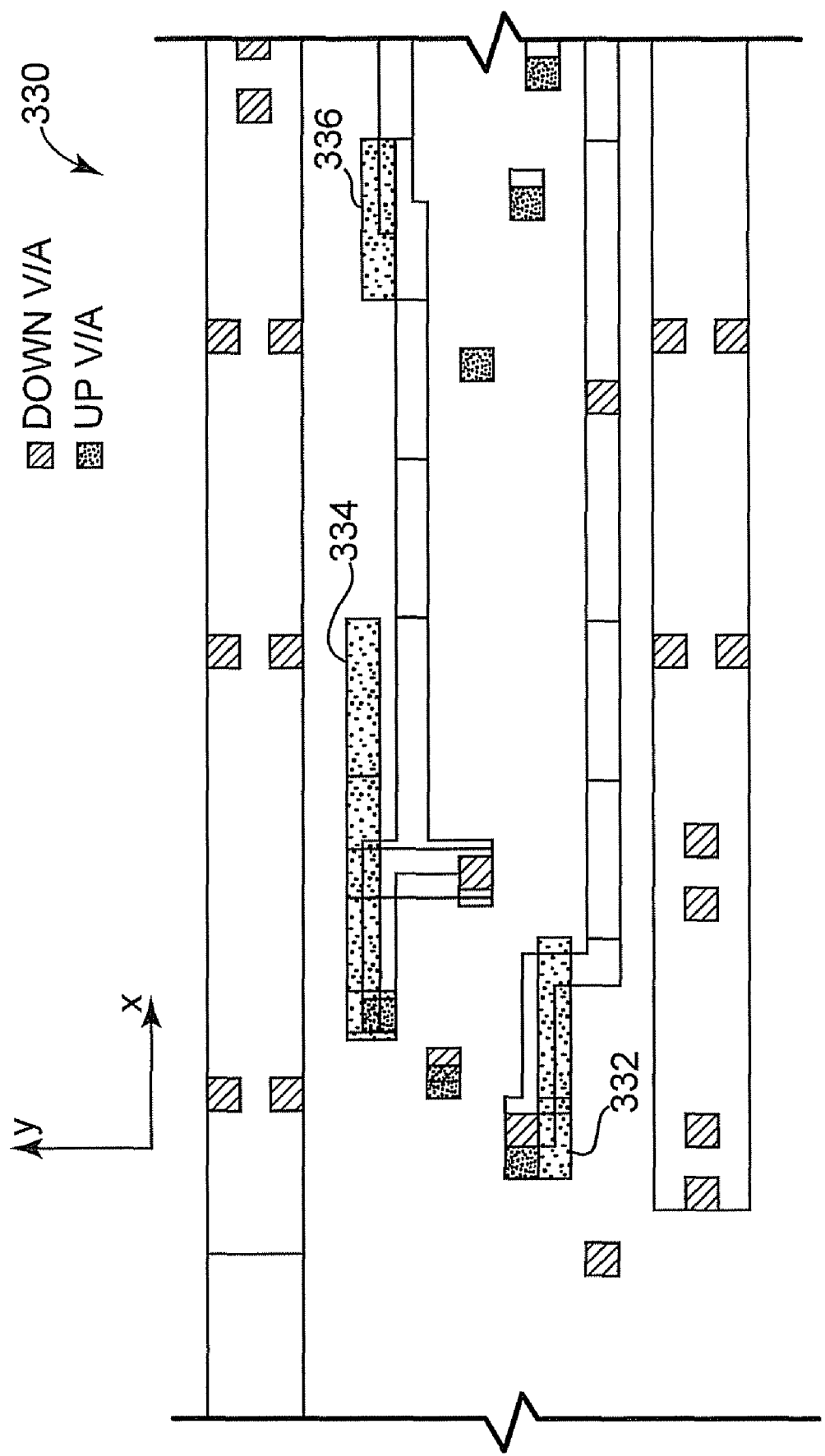
FIG. 29 illustrates an example of replacement shapes according to one embodiment.

FIG. 29 shows a portion of an incoming wire layout 330 and illustrates replacement shapes 332, 334, and 336 proximate to their corresponding complex group. FIG. 29 illustrates multiple replacement shapes being applied to simplify the shape of a single wire and further illustrates a replacement shape (i.e. replacement shape 336) for a complex group containing a single complex brick.

Figure 30:
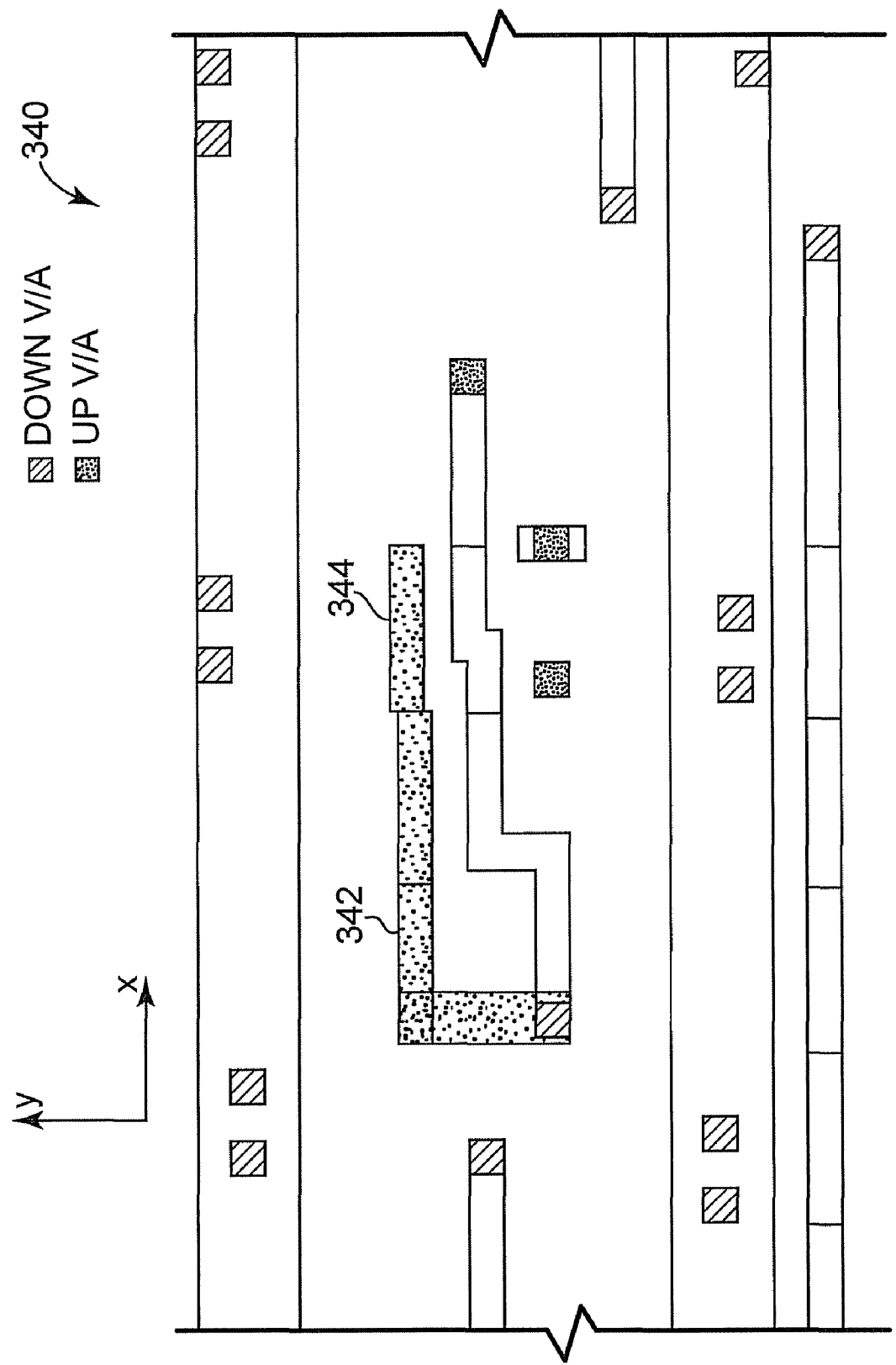
FIG. 30 illustrates an example of a replacement shape according to one embodiment.

FIG. 30 shows a portion of an incoming wire layout 340 and illustrates replacement shapes 342 and 344 proximate to their corresponding complex groups. In FIG. 30, the complex groups corresponding to replacement shapes 182 and 184 are consecutive complex groups which represent an example of a complex series.

By forming simple via cluster shapes about via holes and via hole clusters, and by replacing complex shapes (i.e. complex groups) with simple rectangular replacement shapes, the shape simplification process as described by embodiments herein reduces the occurrence of complex or ugly shapes, and thereby reduces the occurrence of litho hot spots through construction as opposed to correction. Additionally, by reducing the occurrence of complex shapes and structures, and by grouping bricks to avoid insertion of jogs between identified brick pairs, embodiments of the shape simplification processes described herein improve the operation, efficiency, and results of later applied processing techniques such as SFF and "Hot Spot Fixing".

Figure 31:
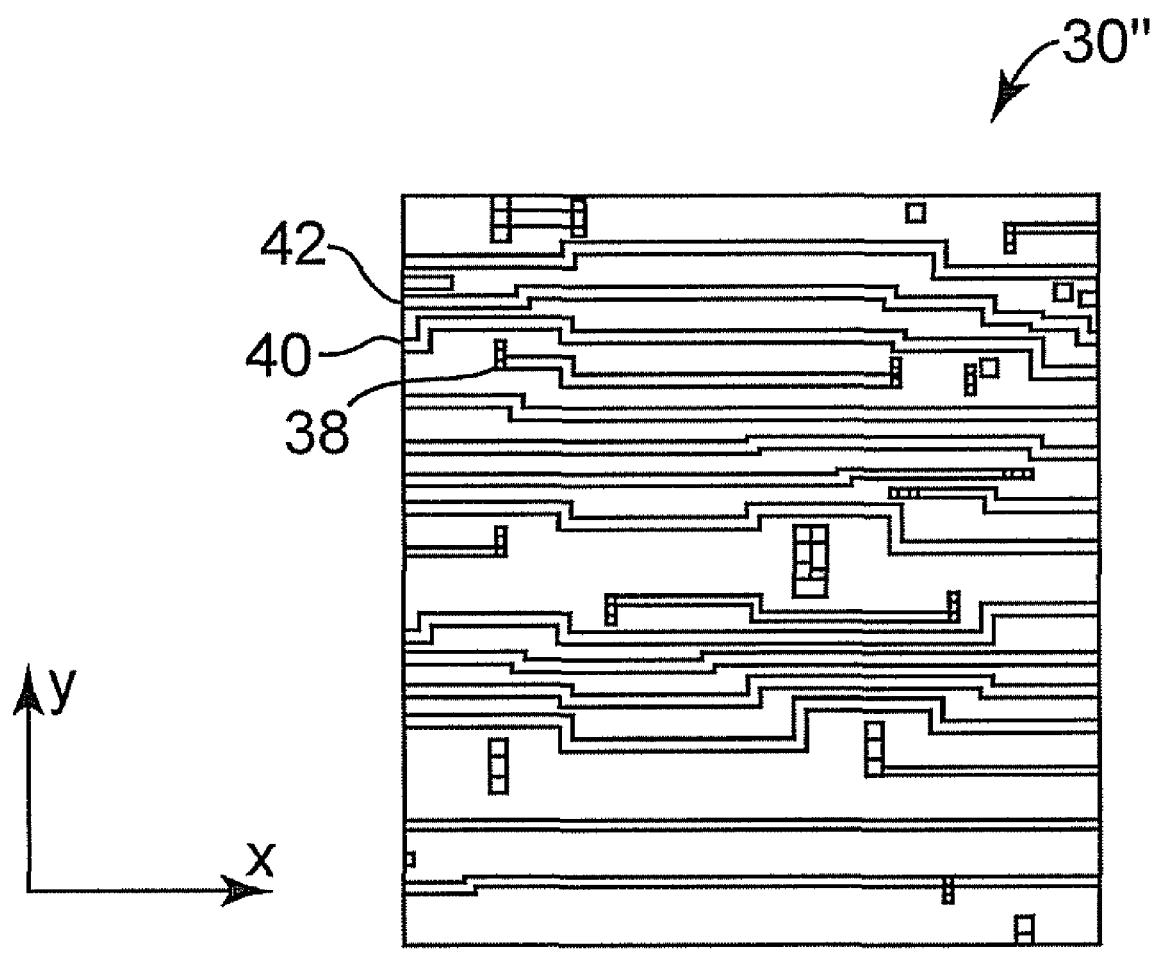
FIG. 31 illustrates the wire layout of FIG. 1 after modification according to one embodiment.

For example, FIG. 31 illustrates a modified wire layout 30" resulting from the application of an SFF process to the incoming wire layout 30 of FIG. 1 after shape simplification processes, such as those described above, have first been applied to incoming wire layout 30 to form via cluster shapes about via holes and via hole clusters, to group bricks, and to replace as much as possible complex shapes with simple rectangular shapes. As previously described, FIG. 2 illustrates a modified wire layout 30' resulting from the application of the SFF process to incoming wire layout 30 of FIG. 1 without be modified by shape simplification processes according to embodiments described herein.

Figure 2:
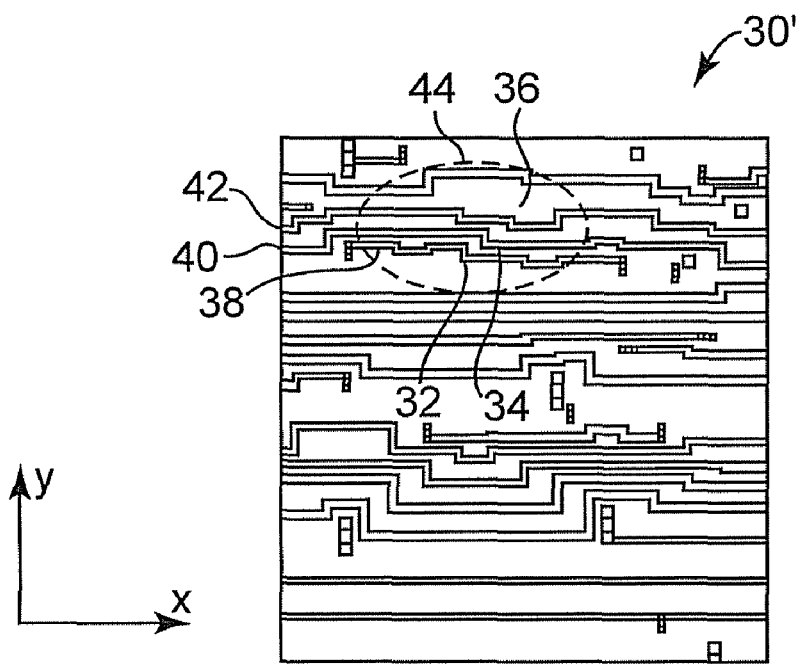
FIG. 2 illustrates the wiring layout of FIG. 1 after modification by a post processing technique.

Comparing modified wire layout 30" of FIG. 31 to modified wire layout 30' of FIG. 2, it is apparent that the wires of wire layout 30" have been more effectively widened (e.g. portions of wires not widened in wire layout 30' are widened in wire layout 30") and spaced with far fewer jogs being inserted into the wires. In particular, jogs 32, 34, and 36, and nearly all other jogs in wires 38, 40, and 42 within the dashed circle 44 of wire layout 30' of FIG. 2, have been eliminated in wire layout 30" of FIG. 31. Additionally, the wire jogs in wire layout 30" of FIG. 31 are spaced further apart and from via holes relative to wire layout 30' of FIG. 2. As a result, modified wire layout 30" of FIG. 31 has the reduced potential for complex or ugly shapes and, as such, is likely to have fewer litho hot spots relative to wire layout 30'.

In one embodiment, not illustrated herein, an incoming wire layout which was "pre-processed" using shape simplification techniques similar to those described herein prior to application of SFF processes achieved a 23% critical area improvement after application of the SFF processed compared to only a 10% critical area improvement when the SFF process was applied directly to the initial incoming wire layout. This improvement was obtained with no increase in the number of spacing violations.

Figure 32:
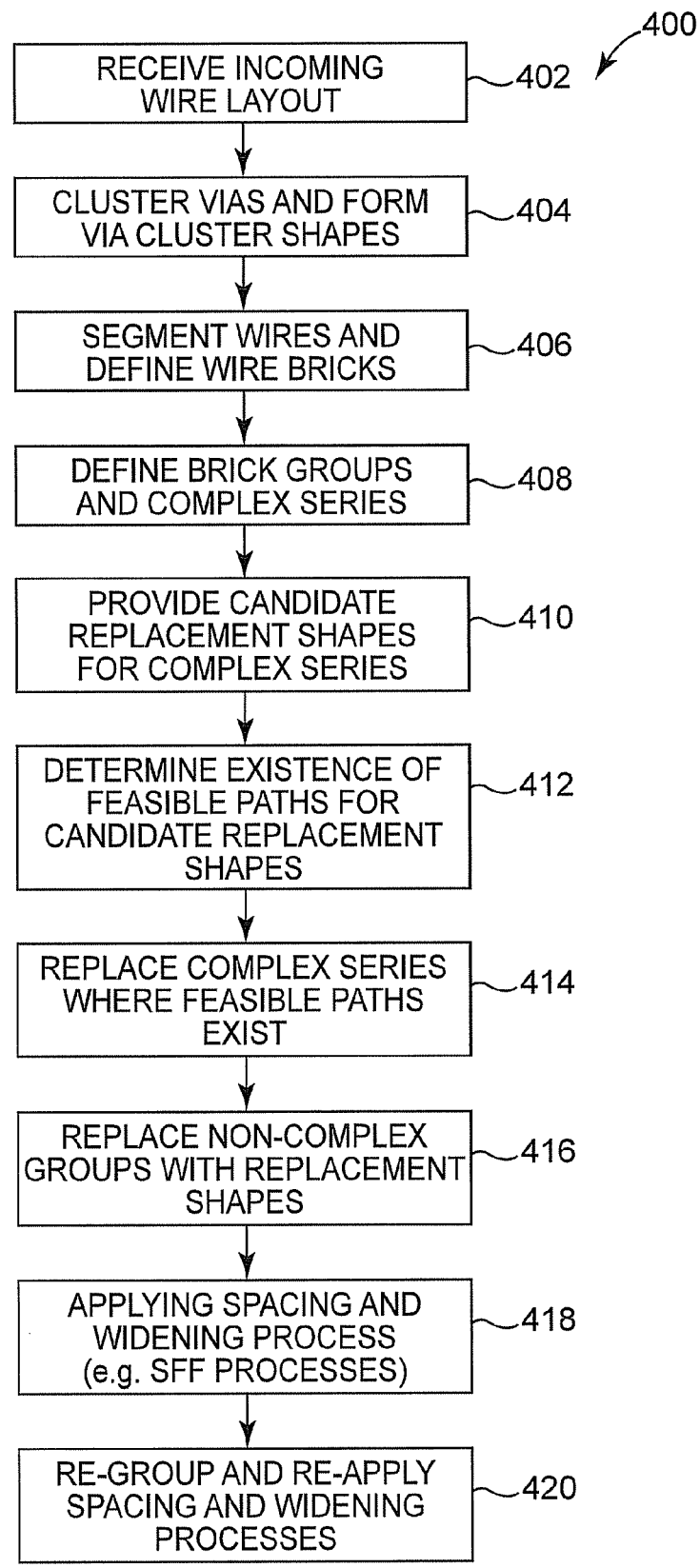
FIG. 32 is a flow diagram illustrating a process for configuring an integrated circuit including shape simplification according to one embodiment.

FIG. 32 is a flow diagram illustrating one embodiment of a process 400 for configuring an integrated circuit including shape simplification. Process 400 begins at 402 with receiving an incoming wire layout for at least one metal layer of an integrated circuit which includes a plurality of wires running in a preferred direction and a plurality of vias connected thereto. In one embodiment, the incoming wire layout is provided by an automated routing tool. In one embodiment, the preferred direction is a horizontal or x-direction. In one embodiment, the integrated circuit includes a first metallization layer (Metal-1) positioned above a substrate, with the at least one metal layer comprising an upper metallization layer positioned above the Metal-1 layer, such as a second metallization layer (Metal-2), for example.

At 404, vias in the at least one layer which are of a same wire and which are spaced from one another by less than a desired separation distance are grouped to form via clusters, and via cluster shapes are formed about each via cluster and about each via which is not part of a cluster, using techniques such as described above with respect to FIGS. 3 through 12, for example. It is noted that vias of a same cluster may connect to different wires in metal layers positioned above (layer n+1) and below (layer n−1) the at least one layer in which the via cluster is positioned (layer n). In one embodiment, the via cluster shapes are rectangular. In one embodiment, each via cluster shape has a dimension in the preferred direction which either provides at least a desired overhang distance in the preferred direction on both sides of each via bounded by the via cluster shape or which matches a required minimum lateral width of the wire to which the vias bounded by the via cluster shape are connected, whichever is greater.

At 406, each of the wires is segmented into a plurality of bricks using a set of equally spaced parallel grid lines running perpendicular to the preferred direction such that each wire comprises a series of consecutive bricks, such as illustrated by FIG. 26A, for example. In one embodiment, the grid lines are spaced such that bricks have a dimension in the preferred direction which is five times a minimum wire width required by applicable design rule. According to one embodiment, bricks which are rectangular in shape are defined as "regular" bricks and bricks which are non-rectangular are defined as "complex" bricks.

At 408, brick groups are defined based on one or more grouping criteria. According to one embodiment, each group contains one or more consecutive bricks of a same wire with each brick belonging to only one group such that each wire comprises a series of one or more consecutive groups. Groups containing at least one complex group are defined as complex groups. It is noted that groups often contain only a single brick. Additionally, complex series are defined, with a complex series containing one or more consecutive complex groups of a same wire. Again, it is noted that complex series often contain only a single complex group.

At 410, a candidate replacement shape or wire is provided for each complex group of each series. According to one embodiment, each candidate replacement shape is a rectangle having a dimension in the preferred direction equal to the sum of the dimensions in the preferred direction of each brick of the corresponding complex group and a dimension perpendicular to the preferred direction equal to a lateral dimension of the wire of which the corresponding complex group is a part. Portions of the corresponding wire connected to each end of a complex series are defined as first and second terminals, or left-hand and right-hand terminals. Examples of candidate replacement shapes are illustrated above by FIGS. 14 and FIGS. 26 through 29.

At 412, process 400 determines for each complex series whether a feasible path exists for connecting the one or candidate replacement shapes of the constituent complex groups so as to form a path between the first and second terminals, employing techniques such as those described above by FIGS. 15 through 20, for example. At 414, when no feasible path exists, the candidate replacement shapes are discarded and the complex groups of the complex series are retained. However, if at least one feasible path exists, process 400 replaces the complex series with the one or more corresponding replacement shapes and deleted the one or more complex groups of the complex series.

According to one embodiment, if a subsequent spacing and widening process (e.g. SFF process) will not be applied, the candidate replacement shapes are placed at positions based on one or more position criteria, such as minimizing a number of wire jogs, for example, such as illustrated above by FIG. 20. If a spacing and widening process (e.g. SFF process, see 418 below) is to be subsequently applied, the candidate replacement shapes are positioned at only a feasible position and will later be moved to an optimal or final position by the SFF process, such as illustrated by the example of FIG. 23.

At 416, if a SFF process is to be subsequently applied, replacement shapes are also provided for groups other than those included as part of a complex series (i.e. non-complex groups), such as illustrated by replacement shape 130 of FIG. 14, for example. For such non-complex groups, each replacement shape comprises a rectangle having a dimension in the preferred direction equal to the sum of the dimensions in the preferred direction of the bricks of the corresponding non-complex group and a dimension perpendicular to the preferred direction equal to a lateral dimension of the wire of which the corresponding non-complex group is a part. Such replacement shapes do not modify or simply the already simple rectangular shape of non-complex groups.

According to one embodiment, as illustrated at 418, process 400 applies a spacing and widening process (e.g. SFF process) to increase the dimension in the direction perpendicular to the preferred direction of selected replacement shapes and selected candidates shapes which have replaced complex groups, and to move selected replacement shapes and selected candidates shapes which have replaced complex groups in the direction perpendicular to the preferred direction so as to adjust spacing there between. Similarly, SFF processes may also move and widen regular bricks which were not "repaired" by the above described shape replacement procedures (i.e. not only regular bricks created by the replacement procedures, but also bricks created by the "bricking" of the incoming layout). Dimensions and positions of via cluster shapes and complex groups not replaced with candidate replacement shapes are not modified by the spacing and widening process. Examples of the SFF process are illustrated by FIGS. 21 though 24 and by FIG. 32.

In one embodiment, as indicated at 420, after the SFF process has performed multiple iterations of widening and spacing the replacement shapes and other regular bricks, process 400 re-segments the wires into a plurality of bricks (in particular, the replacement and candidate replacement shapes) by re-applying the parallel grid lines. The resulting bricks are re-grouped so that regular bricks of a same wire which are aligned with one another in the direction perpendicular to the preferred direction (i.e. y-direction) are formed into groups. The spacing and widening process is then re-applied to the re-grouped bricks. The purpose of re-grouping is to reduce the number of jogs in the wire layout and to further reduce critical area. According to one embodiment, the re-grouping and re-application of the SFF process is iteratively performed until a critical area metric is optimized.

Although embodiments of the processes for shape simplification and for configuring an integrated circuit are described above as being applied to an incoming layout received from a standard routing tool, it is noted that these processes may be incorporated or configured as part of a conventional routing tool. In such a configuration, the so-called "incoming" wire layout, such as incoming wire layout 30, represents only an "intermediate" wire layout determined internally by the routing tool, and which may not be visible or viewable by a user. The shape simplification processes, according to embodiments described herein, would then be applied this intermediate wire layout so that the wire layout provided by the routing tool would include the simplified shapes and reduced occurrence of so-called "ugly" shapes.

It will be understood by a person of ordinary skill in the art that the methods of shape simplification and configuring an integrated circuit as described herein, such as illustrated by process 400 of FIG. 32, for example, may be implemented in hardware, software, firmware, or any combination thereof The implementation may be via a microprocessor, programmable logic device, or state machine. Components of the present invention may reside in software on one or more computer-readable mediums. The term computer-readable medium as used herein is defined to include any kind of memory, volatile or non-volatile, such as floppy disks, hard disks, CD-ROMs, flash memory, read-only memory, and random access memory.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of making an integrated circuit including simplifying metal shapes, the method comprising:
   receiving, with a processor, an initial wire layout for at least one metal layer of an integrated circuit, the initial wire layout for the at least one layer including a plurality of wires running in a preferred direction and a plurality of vias connected thereto;

segmenting, with the processor, each of the wires into a plurality of bricks according to a set of equally spaced parallel grid lines extending in direction which is perpendicular to the preferred direction such that each wire comprises a series of consecutive bricks with brick boundaries between consecutive bricks occurring at a grid line;

defining, with the processor, each brick as a regular or a complex brick based on at least one brick criteria; and defining, with the processor, brick groups such that each group contains one or more consecutive bricks of a same wire and each brick belongs to only one group so that each wire comprises a series of one or more consecutive groups, wherein groups containing at least one complex brick are defined as complex groups.

2. The method of claim 1, wherein the at least one brick criteria comprises a shape of a bricks, wherein a bricks having a non-rectangular shape is defined as a complex bricks.

3. The method of claim 1, wherein the grid lines are spaced at a multiple of a minimum wire width required by design rules applied to the wiring layout.

4. The method of claim 1, wherein defining a brick group includes evaluating a position of a brick boundary relative to a via hole such that if a brick boundary is less than a desired distance from a via hole, the bricks forming the brick boundary are assigned to a same group.

5. The method of claim 1, including:

defining one or more consecutive complex groups of a same wire as a complex series, wherein each complex series contains one or more complex groups and each complex group belongs to only one complex; and providing a candidate replacement shape for each complex group of each complex series, wherein each candidate replacement shape comprises a rectangle having a dimension in the preferred direction equal to the sum of the dimensions in the preferred direction of each brick of the corresponding complex group and a dimension perpendicular to the preferred direction equal to a lateral dimension of the wire of which the corresponding complex group is a part.

6. The method of claim 5, including:

defining portions of a wire connected to each end of a complex series as first and second terminals;

determining for each complex series whether a feasible path exists for connecting the one or more candidate replacement shapes for the one or more complex groups of the complex series to form a path between the first and second terminals at each end of the complex series; and replacing a complex series with the one or more corresponding candidate replacement shapes when a feasible path exists and retaining the complex series if no feasible path exists.

7. The method of claim 6, wherein determining for each complex series whether a feasible path exists includes:

defining a feasibility interval in a direction perpendicular to the preferred direction for the candidate replacement shape of each complex group of the complex series;

defining feasibility intervals in a direction perpendicular to the preferred direction for connector wires which may be required to connect the one or more candidate replacement shapes of the complex series to one another and to the first and second terminals; and performing a tree search to determine whether the first and second terminals can be linked via the feasibility intervals.

8. The method of claim 7, wherein replacing a complex series with the one or more corresponding candidate replacement shapes when a feasible path exists includes:

locating each candidate replacement shape at a position perpendicular to the preferred direction within the corresponding feasibility interval based on one or more path criteria.

9. The method of claim 8, wherein the one or more path criteria include minimizing a number of connector wires required for the feasible path and optimizing spacing of candidate replacement shapes and connector wires from neighboring structures of the wire layout.

* * * * *